(12) United States Patent
Takeuchi et al.

(10) Patent No.: US 10,777,395 B2
(45) Date of Patent: Sep. 15, 2020

(54) PROCESSING APPARATUS AND COLLIMATOR

(71) Applicant: Kabushiki Kaisha Toshiba, Minato-ku (JP)

(72) Inventors: Masakatsu Takeuchi, Obu (JP); Shiguma Kato, Yokohama (JP); Yasuhiro Aoyama, Yokkaichi (JP); Takahiro Terada, Yokohama (JP); Yoshinori Tokuda, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 327 days.

(21) Appl. No.: 15/755,712

(22) PCT Filed: Dec. 19, 2016

(86) PCT No.: PCT/JP2016/087825
§ 371 (c)(1),
(2) Date: Feb. 27, 2018

(87) PCT Pub. No.: WO2017/158981
PCT Pub. Date: Sep. 21, 2017

(65) Prior Publication Data
US 2019/0027346 A1    Jan. 24, 2019

(30) Foreign Application Priority Data

Mar. 14, 2016  (JP) .................... 2016-050219

(51) Int. Cl.
*C23C 14/34* (2006.01)
*H01J 37/34* (2006.01)
(Continued)

(52) U.S. Cl.
CPC .......... *H01J 37/3447* (2013.01); *C23C 14/35* (2013.01); *C23C 14/564* (2013.01);
(Continued)

(58) Field of Classification Search
CPC .................................... H01J 37/3447
See application file for complete search history.

(56) References Cited

U.S. PATENT DOCUMENTS 5,643,428 A   7/1997  Krivokapic et al.
6,362,097 B1  3/2002  Demaray et al.
(Continued)

FOREIGN PATENT DOCUMENTS

JP  2006-328456 A  12/2006
JP  2008-257759 A  10/2008
(Continued)

OTHER PUBLICATIONS

International Search Report dated Feb. 7, 2017 in PCT/JP2016/087825 filed Dec. 19, 2016.

*Primary Examiner* — Jason Berman
(74) *Attorney, Agent, or Firm* — Oblon, McClelland, Maier & Neustadt, L.L.P.

(57) ABSTRACT

A processing apparatus according to an embodiment includes an object placement unit, a source placement unit, a flow rectifying member, and a power supply. The object placement unit is configured to have an object placed thereon. The source placement unit is disposed apart from the object placement unit and configured to have a particle source capable of ejecting a particle toward the object placed thereon. The flow rectifying member is disposed between the object placement unit and the source placement unit in a first direction from the source placement unit to the object placement unit. The power supply is configured to apply, to the flow rectifying member, a voltage having the same polarity as that of an electric charge in the particle.

9 Claims, 16 Drawing Sheets

(51) Int. Cl.
*C23C 14/56* (2006.01)
*C23C 14/35* (2006.01)
*H01L 21/285* (2006.01)

(52) U.S. Cl.
CPC ..... *H01J 37/3455* (2013.01); *H01J 2237/332* (2013.01); *H01L 21/2855* (2013.01)

(56) References Cited

U.S. PATENT DOCUMENTS

2006/0019477 A1* 1/2006 Hanawa .................. C23C 14/48
438/514
2011/0062019 A1* 3/2011 Morimoto ........... C23C 14/3457
204/298.08

FOREIGN PATENT DOCUMENTS

| JP | 5611039 B2 | 10/2014 |
| TW | 436895 B | 5/2001 |
| TW | 585929 B | 5/2004 |

* cited by examiner

PROCESSING APPARATUS AND COLLIMATOR

CROSS-REFERENCE TO RELATED APPLICATIONS

This application is a national stage application of International Application No. PCT/JP2016/087825, filed on Dec. 19, 2016, which designates the United States, incorporated herein by reference, and which is based upon and claims the benefit of priority from Japanese Patent Application No. 2016-050219, filed on Mar. 14, 2016, the entire contents of each of which are incorporated herein by reference.

FIELD

Embodiments described herein relate generally to a processing apparatus and a collimator.

BACKGROUND

Sputtering apparatuses that deposit a metal on a semiconductor wafer, for example, include a collimator that aligns the directions of metal particles to be deposited. The collimator includes walls having a number of through holes. The collimator allows particles flying in directions substantially perpendicular to a to-be-processed object to pass therethrough and blocks particles flying obliquely.

DETAILED DESCRIPTION

According to an embodiment, a processing apparatus includes an object placement unit, a source placement unit, a flow rectifying member, and a power supply. The object placement unit is configured to have an object placed thereon. The source placement unit is disposed apart from the object placement unit and configured to have a particle source capable of ejecting a particle toward the object placed thereon. The flow rectifying member is configured to be disposed between the object placement unit and the source placement unit in a first direction from the source placement unit to the object placement unit. The power supply is configured to apply, to the flow rectifying member, a voltage having the same polarity as that of an electric charge in the particle.

A first embodiment is described below with reference to FIGS. 1 to 6. In the present specification, upward in the vertical direction is basically defined as an upward direction, and downward in the vertical direction is defined as a downward direction. In the present specification, components according to embodiments and explanations of the components are described with a plurality of expressions. The components and the explanations described with a plurality of expressions may be described with other unused expressions. Furthermore, components and explanations described not with a plurality of expressions may be described with other unused expressions.

Figure 1:
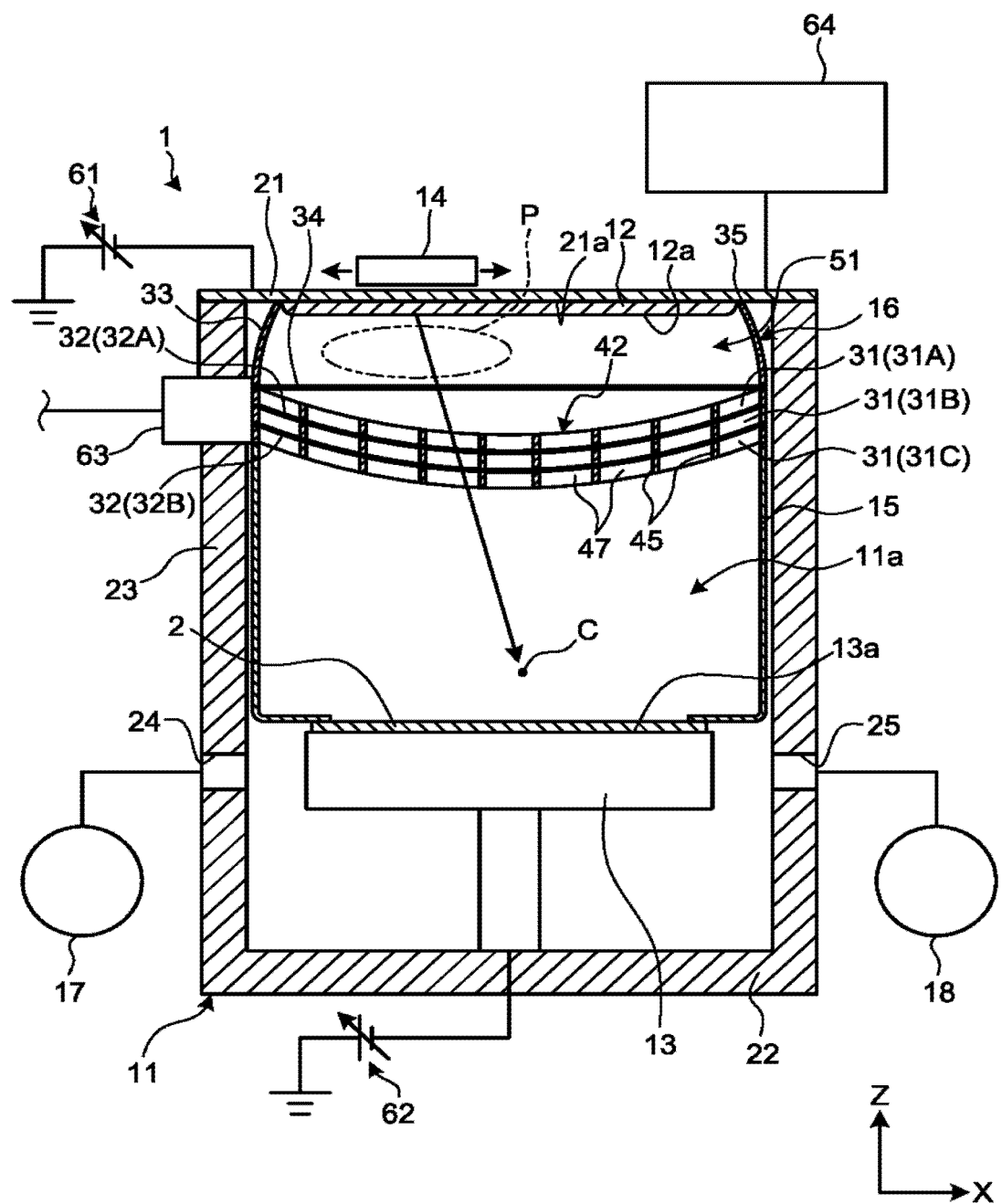
FIG. 1 is a sectional view schematically illustrating a sputtering apparatus according to a first embodiment.

FIG. 1 is a sectional view schematically illustrating a sputtering apparatus 1 according to the first embodiment. The sputtering apparatus 1 is an example of a processing apparatus and may also be referred to as a semiconductor manufacturing apparatus, a manufacturing apparatus, a processing apparatus, or an apparatus, for example.

The sputtering apparatus 1 is an apparatus that performs magnetron sputtering, for example. The sputtering apparatus 1, for example, deposits metal particles on the surface of a semiconductor wafer 2. The semiconductor wafer 2 is an example of an object and may also be referred to as a subject, for example. The sputtering apparatus 1 may perform deposition on other subjects, for example.

The sputtering apparatus 1 includes a chamber 11, a target 12, a stage 13, a magnet 14, a shielding member 15, a collimator 16, a pump 17, and a tank 18. The target 12 is an example of a particle source. The magnet 14 may also be referred to as a magnetic field generating unit, for example. The collimator 16 is an example of a flow rectifying member and may also be referred to as a shielding part, a flow straightening part, or a direction adjusting part, for example.

As illustrated in the drawings, an X-axis, a Y-axis, and a Z-axis are defined in the present specification. The X-axis, the Y-axis, and the Z-axis are orthogonal to each other. The X-axis extends along the width of the chamber 11. The Y-axis extends along the depth (length) of the chamber 11. The Z-axis extends along the height of the chamber 11. In the following description, explanation is made assuming that the Z-axis extends along the vertical direction. The Z-axis of the sputtering apparatus 1 may obliquely intersect the vertical direction.

The chamber 11 has a sealable box shape. The chamber 11 has an upper wall 21, a bottom wall 22, a side wall 23, an outlet 24, and an inlet 25. The upper wall 21 may also be referred to as a backing plate, an attachment portion, or a holding portion, for example.

The upper wall 21 and the bottom wall 22 are disposed facing each other in a direction along the Z-axis (vertical direction). The upper wall 21 is positioned above the bottom wall 22 with a predetermined space interposed therebetween. The side wall 23 has a tubular shape extending in the direction along the Z-axis and connects the upper wall 21 and the bottom wall 22.

The chamber 11 has a processing chamber 11a inside thereof. The processing chamber 11a may also be referred to as the inside of a container. The inner surfaces of the upper wall 21, the bottom wall 22, and the side wall 23 form the processing chamber 11a. The processing chamber 11a can be closed airtightly. In other words, the processing chamber 11a can be sealed. The airtightly closed state means a state where no gas moves between the inside and the outside of the processing chamber 11a. The outlet 24 and the inlet 25 may be formed in the processing chamber 11a.

The target 12, the stage 13, the shielding member 15, and the collimator 16 are disposed in the processing chamber 11a. In other words, the target 12, the stage 13, the shielding member 15, and the collimator 16 are accommodated in the chamber 11. The target 12, the stage 13, the shielding member 15, and the collimator 16 may be partially positioned outside the processing chamber 11a.

The outlet 24 is formed in the processing chamber 11a and connected to the pump 17. The pump 17 is a dry pump, a cryopump, or a turbomolecular pump, for example. The pump 17 sucks gas in the processing chamber 11a from the outlet 24, thereby reducing the air pressure in the processing chamber 11a. The pump 17 can evacuate the processing chamber 11a.

The inlet 25 is formed in the processing chamber 11a and connected to the tank 18. The tank 18 accommodates inert gas, such as argon gas. The argon gas output from the tank 18 passes through the inlet 25 and can enter into the processing chamber 11a. The tank 18 includes a valve that can stop entry of the argon gas.

The target 12 is a disc-shaped metal plate used as a source of particles, for example. The target 12 may have another shape. The target 12 according to the present embodiment is made of copper, for example. The target 12 may be made of other materials.

The target 12 is attached to an attachment surface 21a of the upper wall 21 of the chamber 11. The upper wall 21 serving as a backing plate is used as a cooling material and an electrode for the target 12. The chamber 11 may include a backing plate serving as a part separated from the upper wall 21.

The attachment surface 21a of the upper wall 21 is the inner surface of the upper wall 21 facing in a negative direction (downward direction) along the Z-direction and having a substantially flat shape. The target 12 is placed on the attachment surface 21a. The upper wall 21 is an example of a source placement unit. The source placement unit is not limited to an individual member or part and may be a specific position on a certain member or part.

The negative direction along the Z-axis is opposite to the direction in which the arrow of the Z-axis points. The negative direction along the Z-axis is a direction extending from the attachment surface 21a of the upper wall 21 to a placement surface 13a of the stage 13 and is an example of a first direction. The direction along the Z-axis and the vertical direction include the negative direction along the Z-axis and a positive direction along the Z-axis (direction in which the arrow of the Z-axis points).

The target 12 has a lower surface 12a. The lower surface 12a is a substantially flat surface facing downward. When a voltage is applied to the target 12, the argon gas entering into the chamber 11 is ionized, thereby generating plasma P. The plasma P is indicated by a two-dot chain line in FIG. 1.

The magnet 14 is positioned outside the processing chamber 11a. The magnet 14 is an electromagnet or a permanent magnet, for example. The magnet 14 can move along the upper wall 21 and the target 12. The upper wall 21 is positioned between the target 12 and the magnet 14. The plasma P is generated near the magnet 14. As a result, the target 12 is positioned between the magnet 14 and the plasma P.

When argon ions in the plasma P collide with the target 12, particles C of a deposition material constituting the target 12 fly out from the lower surface 12a of the target 12, for example. In other words, the target 12 can eject the particles C. The particles C according to the present embodiment include copper ions, copper atoms, and copper molecules. The copper ions included in the particles C are positively charged. The copper atoms and the copper molecules may be positively or negatively charged.

The directions in which the particles C fly out from the lower surface 12a of the target 12 are distributed according to the cosine law (Lambert's cosine law). In other words, the number of particles C flying in a normal direction of the lower surface 12a (vertical direction) is the largest of the particles C flying from a certain point on the lower surface 12a. The number of particles C flying in a direction oblique with respect to (obliquely intersecting) the normal direction at an angle $\theta$ is roughly proportional to a cosine ($\cos \theta$) of the number of particles C flying in the normal direction.

The particles C are an example of a particle according to the present embodiment and are fine particles of the deposition material constituting the target 12. The particles may be various particles constituting a substance or an energy line, such as molecules, atoms, ions, atomic nuclei, electrons, elementary particles, vapor (evaporated substance), and electromagnetic waves (photons).

The stage 13 is disposed above the bottom wall 22 of the chamber 11. The stage 13 is disposed apart from the upper wall 21 and the target 12 in the direction along the Z-axis. The stage 13 has the placement surface 13a. The placement surface 13a of the stage 13 supports the semiconductor wafer 2. The semiconductor wafer 2 has a disc-shape, for example. The semiconductor wafer 2 may have another shape, for example.

The placement surface 13a of the stage 13 is a substantially flat surface facing upward. The placement surface 13a is disposed apart from the attachment surface 21a of the upper wall 21 in the direction along the Z-axis and faces the attachment surface 21a. The semiconductor wafer 2 is placed on the placement surface 13a. The stage 13 is an example of an object placement unit. The object placement unit is not limited to an individual member or part and may be a specific position on a certain member or part.

The stage 13 can move in the direction along the Z-axis, that is, the vertical direction. The stage 13 includes a heater and can heat the semiconductor wafer 2 placed on the placement surface 13a. The stage 13 is also used as an electrode.

The shielding member 15 has a substantially tubular shape. The shielding member 15 covers part of the side wall 23 and a space between the side wall 23 and the semiconductor wafer 2. The shielding member 15 may hold the semiconductor wafer 2. The shielding member 15 prevents the particles C ejected from the target 12 from adhering to the bottom wall 22 and the side wall 23.

The collimator 16 is disposed between the attachment surface 21a of the upper wall 21 and the placement surface 13a of the stage 13 in the direction along the Z-axis. In other words, the collimator 16 is disposed between the target 12 and the semiconductor wafer 2 in the direction along the Z-axis (vertical direction). The collimator 16 is attached to the side wall 23 of the chamber 11, for example. The collimator 16 may be supported by the shielding member 15.

The collimator 16 is electrically insulated from the chamber 11. An insulating member, for example, is interposed between the collimator 16 and the chamber 11. The collimator 16 is also electrically insulated from the shielding member 15.

The distance between the collimator 16 and the attachment surface 21a of the upper wall 21 in the direction along the Z-axis is shorter than that between the collimator 16 and the placement surface 13a of the stage 13. In other words, the collimator 16 is closer to the attachment surface 21a of the upper wall 21 than the placement surface 13a of the stage 13. The position of the collimator 16 is not limited thereto.

Figure 2:
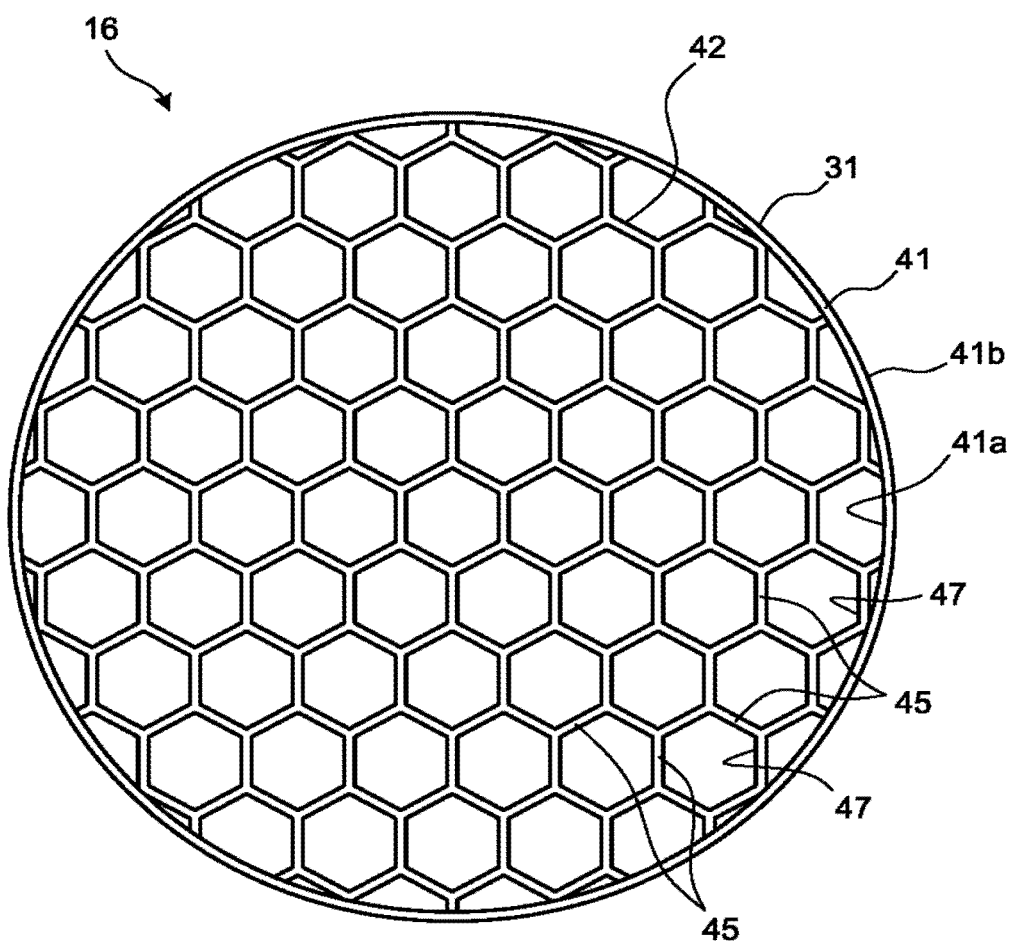
FIG. 2 is a plan view of a collimator according to the first embodiment.
Figure 3:
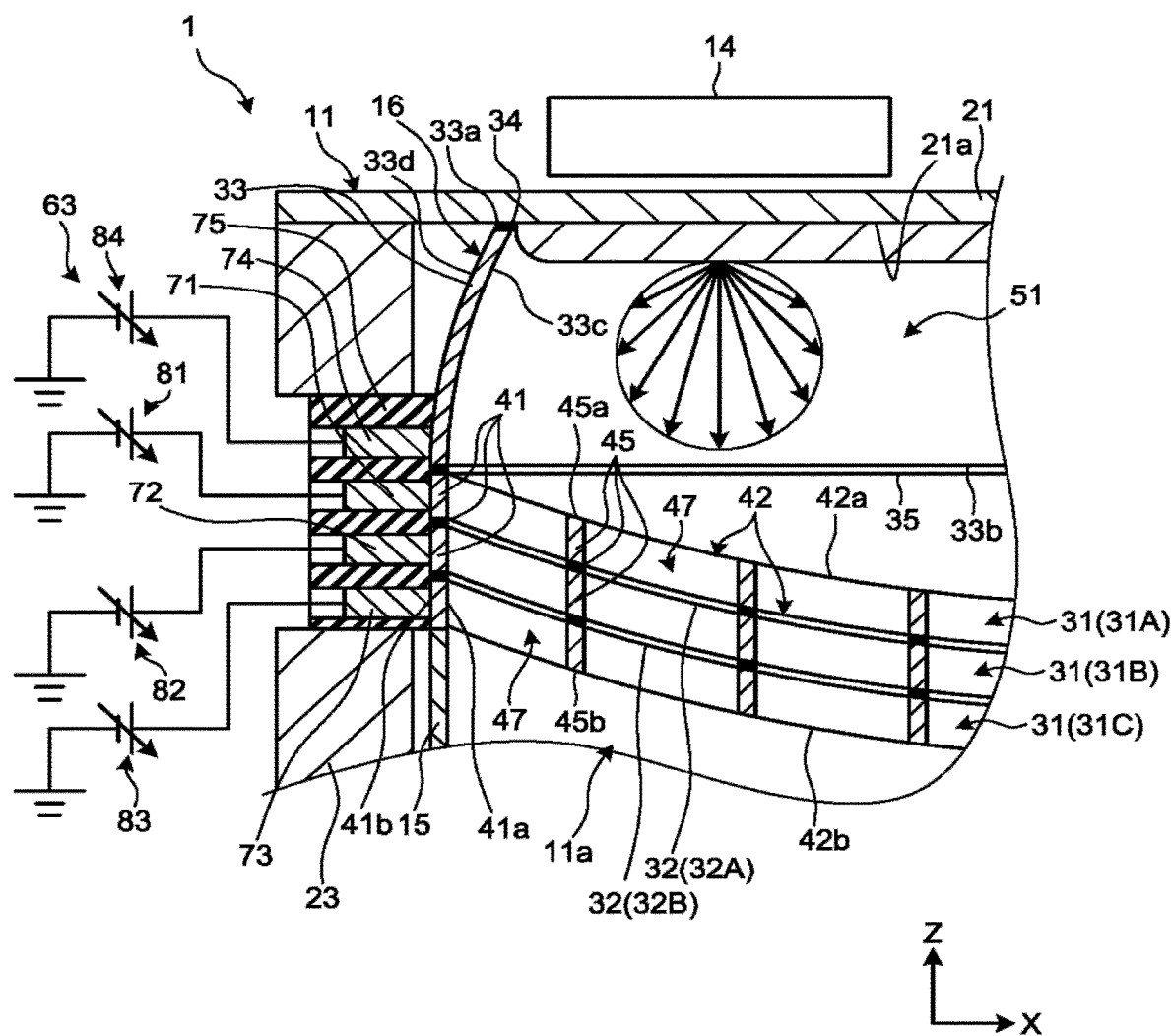
FIG. 3 is a sectional view of part of the sputtering apparatus according to the first embodiment.

FIG. 2 is a plan view of the collimator 16 according to the first embodiment. FIG. 3 is a sectional view of part of the sputtering apparatus 1 according to the first embodiment. As illustrated in FIG. 3, the collimator 16 includes three collimating units 31, two intervening members 32, a reflector 33, a first gasket 34, and a second gasket 35. FIG. 2 does not illustrate the reflector 33.

The three collimating units 31 include a collimating unit 31A, a collimating unit 31B, and a collimating unit 31C. The collimating unit 31A is an example of a first collimator. The collimating unit 31B is an example of the first collimator and a second collimator. The collimating unit 31C is an example of the second collimator. In the following description, explanation common to the collimating units 31A, 31B, and 31C is described as explanation of the collimating units 31.

The three collimating units 31 each include a frame 41 and a flow rectifying unit 42. The frame 41 may also be referred to as an outer rim, a holding portion, a supporting portion, or a wall. At least one of the collimating units 31A, 31B, and 31C does not necessarily include the frame 41.

The frame 41 is a wall having a cylindrical shape extending in the direction along the Z-direction. The frame 41 is not limited thereto and may have another shape, such as a rectangular shape. The frame 41 has an inner peripheral surface 41a and an outer peripheral surface 41b.

The inner peripheral surface 41a of the frame 41 is a curved surface facing in the radial direction of the cylindrical frame 41 and faces the central axis of the cylindrical frame 41. The outer peripheral surface 41b is positioned opposite to the inner peripheral surface 41a. The area of the portion surrounded by the outer peripheral surface 41b of the frame 41 on the X-Y plane is larger than the sectional area of the semiconductor wafer 2.

As illustrated in FIG. 2, the flow rectifying unit 42 is provided on the inner side of the cylindrical frame 41 on the X-Y plane. The flow rectifying unit 42 is connected to the inner peripheral surface 41a of the frame 41. The frame 41 and the flow rectifying unit 42 are integrally formed. The flow rectifying unit 42 may be a part provided independently of the frame 41.

As illustrated in FIG. 1, the flow rectifying unit 42 is disposed between the attachment surface 21a of the upper wall 21 and the placement surface 13a of the stage 13. The flow rectifying unit 42 is apart from the upper wall 21 and the stage 13 in the direction along the Z-axis. As illustrated in FIG. 2, the flow rectifying unit 42 has a plurality of walls 45. The walls 45 may also be referred to as plates or shielding portions, for example.

The walls 45 of the collimating unit 31A are an example of a plurality of first walls. The walls 45 of the collimating unit 31B are an example of the first walls and a plurality of second walls. The walls 45 of the collimating unit 31C are an example of the second walls.

The flow rectifying unit 42 has a plurality of through holes 47 formed by the walls 45. The through holes 47 are hexagonal holes extending in the direction along the Z-axis (vertical direction). In other words, the walls 45 form an aggregate (honeycomb structure) of a plurality of hexagonal tubes each having the through hole 47 inside thereof. The through holes 47 extending in the direction along the Z-axis enable an object, such as the particle C, moving in the direction along the Z-axis to pass therethrough. The through holes 47 may have another shape.

The through holes 47 of the collimating unit 31A are an example of a plurality of first through holes. The through holes 47 of the collimating unit 31B are an example of the first through holes and a plurality of second through holes. The through holes 47 of the collimating unit 31C are an example of the second through holes.

The walls 45 of the collimating unit 31A are integrally formed and connected to one another. The integrally formed walls 45 of the collimating unit 31A are connected to the frame 41 of the collimating unit 31A.

The walls 45 of the collimating unit 31B are integrally formed and connected to one another. The integrally formed walls 45 of the collimating unit 31B are connected to the frame 41 of the collimating unit 31B.

The walls 45 of the collimating unit 31C are integrally formed and connected to one another. The integrally formed walls 45 of the collimating unit 31C are connected to the frame 41 of the collimating unit 31C.

As illustrated in FIG. 3, the flow rectifying unit 42 has an upper end 42a and a lower end 42b. The upper end 42a is one end of the flow rectifying unit 42 in the direction along the Z-axis and faces the target 12 and the attachment surface 21a of the upper wall 21. The lower end 42b is the other end of the flow rectifying unit 42 in the direction along the Z-axis and faces the semiconductor wafer 2 supported by the stage 13 and the placement surface 13a of the stage 13.

The through holes 47 are bored from the upper end 42a to the lower end 42b of the flow rectifying unit 42. In other words, the through holes 47 are holes opening toward the target 12 and the semiconductor wafer 2 supported by the stage 13.

The walls 45 are substantially rectangular (quadrangular) plates extending in the direction along the Z-axis. The walls 45 may extend in a direction obliquely intersecting the direction along the Z-axis, for example. The walls 45 each have an upper end surface 45a and a lower end surface 45b.

The upper end surface 45a of the wall 45 is one end of the wall 45 in the direction along the Z-axis and faces the target 12 and the attachment surface 21a of the upper wall 21. The upper end surfaces 45a of the walls 45 serve as the upper end 42a of the flow rectifying unit 42.

The upper end 42a of the flow rectifying unit 42 is recessed like a curved surface with respect to the target 12 and the attachment surface 21a of the upper wall 21. In other words, the upper end 42a is curved away from the target 12 and the attachment surface 21a of the upper wall 21. The upper end 42a of the flow rectifying unit 42 may have another shape.

The lower end surface 45b of the wall 45 is the other end of the wall 45 in the direction along the Z-axis and faces the semiconductor wafer 2 supported by the stage 13 and the placement surface 13a of the stage 13. The lower end surfaces 45b of the walls 45 serve as the lower end 42b of the flow rectifying unit 42.

The lower end 42b of the flow rectifying unit 42 protrudes toward the semiconductor wafer 2 supported by the stage 13 and the placement surface 13a of the stage 13. In other words, the lower end 42b of the flow rectifying unit 42 comes closer to the stage 13 as it is away from the frame 41. The lower end 42b of the flow rectifying unit 42 may have another shape.

The upper end 42a and the lower end 42b of the flow rectifying unit 42 have substantially the same shape (radius of curvature). As a result, the lengths of the respective walls 45 are substantially equal in the direction along the Z-axis. The length of the walls 45 of the collimating unit 31A, the length of the walls 45 of the collimating unit 31B, and the length of the walls 45 of the collimating unit 31C are substantially equal. The length of the walls 45 is not limited thereto.

The three collimating units 31 are arranged in the direction along the Z-axis. The collimating unit 31B is positioned between the collimating unit 31A and the collimating unit 31C in the direction along the Z-axis. In other words, the collimating unit 31B is disposed closer to the stage 13 than the collimating unit 31A. The collimating unit 31C is disposed closer to the stage 13 than the collimating unit 31B.

The collimating units 31 are made of a metal, such as aluminum or copper. As a result, the collimating units 31 have electrical conductivity. The three collimating units 31 may be made of respective different materials. The material of the frame 41 may be different from that of the flow rectifying unit 42.

The two intervening members 32 include an intervening member 32A and an intervening member 32B. In the following description, explanation common to the intervening members 32A and 32B is described as explanation of the intervening members 32.

The intervening members 32 are made of an insulating material, such as ceramics. The two intervening members 32 may be made of respective different materials.

Similarly to the collimating unit 31, the intervening member 32 according to the present embodiment includes a frame 41 and a flow rectifying unit 42. In other words, the intervening member 32 has a plurality of walls 45. The walls 45 of the intervening member 32 form a plurality of through holes 47. The walls 45 of the intervening member 32 are an example of third walls. The through holes 47 of the intervening member 32 are an example of a plurality of third through holes.

The length of the walls 45 of the intervening member 32 in the direction along the Z-axis is shorter than that of the walls 45 of the collimating unit 31. The length of the frame 41 of the intervening member 32 in the direction along the Z-axis is shorter than that of the frame 41 of the collimating unit 31. The size of the collimating unit 31 and the size of the intervening member 32 in the direction along the Z-axis are not limited thereto.

The intervening member 32A is disposed between the collimating unit 31A and the collimating unit 31B. In other words, the walls 45 of the insulating intervening member 32A are disposed between the walls 45 of the conductive collimating unit 31A and the walls 45 of the conductive collimating unit 31B.

The intervening member 32B is disposed between the collimating unit 31B and the collimating unit 31C. In other words, the walls 45 of the insulating intervening member 32B are disposed between the walls 45 of the conductive collimating unit 31B and the walls 45 of the conductive collimating unit 31C. The three collimating units 31 and the two intervening members 32 are arranged in the direction along the Z-axis.

The walls 45 of the intervening member 32A are connected to the walls 45 of the collimating unit 31A and the walls 45 of the collimating unit 31B. As a result, the through holes 47 of the intervening member 32A connect (link) the through holes 47 of the collimating unit 31A with the through holes 47 of the collimating unit 31B.

The walls 45 of the intervening member 32B are connected to the walls 45 of the collimating unit 31B and the walls 45 of the collimating unit 31C. As a result, the through holes 47 of the intervening member 32B connect (link) the through holes 47 of the collimating unit 31B with the through holes 47 of the collimating unit 31C.

One through hole 47 of the collimating unit 31A, one through hole 47 of the intervening member 32A, one through hole 47 of the collimating unit 31B, one through hole 47 of the intervening member 32B, and one through hole 47 of the collimating unit 31C form a continuous one through hole (hole). At least one of the through hole 47 of the collimating unit 31A, the through hole 47 of the intervening member 32A, the through hole 47 of the collimating unit 31B, the through hole 47 of the intervening member 32B, and the through hole 47 of the collimating unit 31C may be out of alignment with the other through holes 47 on the X-Y plane.

The through holes 47 of the collimating unit 31A, the through holes 47 of the intervening member 32A, the through holes 47 of the collimating unit 31B, the through holes 47 of the intervening member 32B, and the through holes 47 of the collimating unit 31C have substantially the same shape. The through holes 47 of the collimating unit 31A, the through holes 47 of the intervening member 32A, the through holes 47 of the collimating unit 31B, the through holes 47 of the intervening member 32B, and the through holes 47 of the collimating unit 31C may have respective different shapes.

The reflector 33 is disposed between the upper wall 21 and the stage 13 in the direction along the Z-axis. The reflector 33 is disposed between the upper wall 21 and the collimating unit 31A. The reflector 33 has a substantially tubular shape extending in the direction along the Z-axis. In other words, the reflector 33 has a dome shape protruding toward the upper wall 21 and having openings at an upper end 33a and a lower end 33b. The reflector 33 has an opening 51.

The opening 51 extends in the direction along the Z-axis and is bored through the reflector 33. One end of the opening 51 opens toward the upper wall 21 at the upper end 33a of the reflector 33. The other end of the opening 51 opens toward the stage 13 at the lower end 33b of the reflector 33.

The upper end 33a of the reflector 33 is one end of the reflector 33 in the direction along the Z-axis and faces the upper wall 21. The lower end 33b of the reflector 33 is the other end of the reflector 33 in the direction along the Z-axis and faces the stage 13.

The reflector 33 has an inner peripheral surface 33c and an outer peripheral surface 33d. The inner peripheral surface 33c faces in the radial direction of the substantially tubular shaped reflector 33 and faces the central axis of the substantially tubular shaped reflector 33. The inner peripheral surface 33c forms the opening 51. The outer peripheral surface 33d is positioned opposite to the inner peripheral surface 33c.

The inner peripheral surface 33c faces obliquely downward. Obliquely downward is an example of a third direction and a direction between the direction along the Z-axis and a direction along the X-axis or the Y-axis. The direction along the X-axis or the Y-axis is an example of a second direction. More specifically, obliquely downward is a direction obliquely intersecting the Z-axis and extending from the upper wall 21 to the stage 13 in the direction along the Z-axis.

The inner peripheral surface 33c is a curved surface recessed with respect to the stage 13. As a result, the direction in which one part of the inner peripheral surface 33c faces is different from the direction in which the other part of the inner peripheral surface 33c faces. The direction in which one part of the inner peripheral surface 33c faces and the direction in which the other part of the inner peripheral surface 33c faces are directions obliquely intersecting the Z-axis and extending from the upper wall 21 to the stage 13 in the direction along the Z-axis. The inner peripheral surface 33c may be a surface tapering from the stage 13 to the upper wall 21. The sectional area of the opening 51 on the X-Y plane decreases from the lower end 33b of the reflector 33 to the upper end 33a.

The reflector 33 covers part of the side wall 23. The side wall 23 is covered with the shielding member 15 and the reflector 33 of the collimator 16 between the upper wall 21 and the stage 13 in the direction along the Z-axis. The reflector 33 prevents the particles C ejected from the target 12 from adhering to the side wall 23.

The reflector 33 covers at least part of the attachment surface 21a of the upper wall 21. The reflector 33 also covers the target 12 placed on the attachment surface 21a of the upper wall 21. In other words, at least part of the upper wall 21 is positioned between one part and the other part of the reflector 33 in the direction along the X-axis and the direction along the Y-axis.

The reflector 33 is made of a metal, such as aluminum or copper. As a result, the reflector 33 has electrical conductivity. The reflector 33 and the three collimating units 31 are made of the same material. The reflector 33 and the three collimating units 31 may be made of respective different materials.

The first gasket 34 has a ring shape, for example, and is attached to the upper end 33a of the reflector 33. The first gasket 34 has insulating properties. The first gasket 34 electrically insulates the reflector 33 from the upper wall 21 and the target 12.

The second gasket 35 has insulating properties. The second gasket 35 has a ring shape, for example, and is attached to the lower end 33b of the reflector 33. The second gasket 35 is disposed between the reflector 33 and the frame 41 of the collimating unit 31A. The second gasket 35 electrically insulates the reflector 33 from the collimating unit 31A. The reflector 33 is connected to the frame 41 of the collimating unit 31A with the second gasket 35 interposed therebetween.

The opening 51 of the reflector 33 is connected to the through holes 47 of the three collimating units 31 and the two intervening members 32. The particles C ejected from the target 12 can pass through the opening 51 of the reflector 33 and the through holes 47 of the three collimating units 31 and the two intervening members 32 and fly toward the semiconductor wafer 2 placed on the stage 13.

As illustrated in FIG. 1, the sputtering apparatus 1 includes a first power supply device 61, a second power supply device 62, a third power supply device 63, and a control device 64. The third power supply device 63 is an example of a power supply and an external power supply.

The first power supply device 61 and the second power supply device 62 are direct-current variable power supplies. The first power supply device 61 and the second power supply device 62 may be other type of power supplies. The first power supply device 61 is connected to the upper wall 21 serving as an electrode. The first power supply device 61 can apply a negative voltage, for example, to the upper wall 21 and the target 12. The second power supply device 62 is connected to the stage 13 serving as an electrode. The second power supply device 62 can apply a negative voltage, for example, to the stage 13 and the semiconductor wafer 2.

As illustrated in FIG. 3, the third power supply device 63 includes a first electrode 71, a second electrode 72, a third electrode 73, a fourth electrode 74, an insulating member 75, a first power source 81, a second power source 82, a third power source 83, and a fourth power source 84. The first electrode 71 and the first power source 81 are an example of a first applying unit. The second electrode 72 and the second power source 82 are an example of the first applying unit and a second applying unit. The third electrode 73 and the third power source 83 are an example of the second applying unit.

The first to the fourth electrodes 71 to 74 and the insulating member 75 are provided to the side wall 23 of the chamber 11. The collimator 16 faces the first to the fourth electrodes 71 to 74. The positions of the first to the fourth electrodes 71 to 74 are not limited thereto.

The first electrode 71 is in contact with the outer peripheral surface 41b of the frame 41 of the collimating unit 31A. The first electrode 71 is pressed against the outer peripheral surface 41b of the frame 41 of the collimating unit 31A by a spring, for example. The first electrode 71 electrically connects the collimating unit 31A and the first power source 81.

The second electrode 72 is in contact with the outer peripheral surface 41b of the frame 41 of the collimating unit 31B. The second electrode 72 is pressed against the outer peripheral surface 41b of the frame 41 of the collimating unit 31B by a spring, for example. The second electrode 72 electrically connects the collimating unit 31B and the second power source 82.

The third electrode 73 is in contact with the outer peripheral surface 41b of the frame 41 of the collimating unit 31C. The third electrode 73 is pressed against the outer peripheral surface 41b of the frame 41 of the collimating unit 31C by a spring, for example. The third electrode 73 electrically connects the collimating unit 31C and the third power source 83.

The fourth electrode 74 is in contact with the outer peripheral surface 33d of the reflector 33. The fourth electrode 74 is pressed against the outer peripheral surface 33d of the reflector 33 by a spring, for example. The fourth electrode 74 electrically connects the reflector 33 and the fourth power source 84.

The insulating member 75 is made of an insulating material, such as ceramics. The insulating member 75 is interposed between the first to the fourth electrodes 71 to 74 to provide electrical insulation between the first to the fourth electrodes 71 to 74.

The first to the fourth power sources 81 to 84 are direct-current variable power supplies. The first to the fourth power sources 81 to 84 may be other type of power supplies.

The first power source 81 is electrically connected to the collimating unit 31A via the first electrode 71. The first power source 81 can apply a positive voltage to the collimating unit 31A. The first power source 81 may be capable of applying a negative voltage to the collimating unit 31A.

The second power source 82 is electrically connected to the collimating unit 31B via the second electrode 72. The second power source 82 can apply a positive voltage to the collimating unit 31B. The second power source 82 may be capable of applying a negative voltage to the collimating unit 31B.

The third power source 83 is electrically connected to the collimating unit 31C via the third electrode 73. The third power source 83 can apply a positive voltage to the collimating unit 31C. The third power source 83 may be capable of applying a negative voltage to the collimating unit 31C.

The fourth power source 84 is electrically connected to the reflector 33 via the fourth electrode 74. The fourth power source 84 can apply a positive voltage to the reflector 33. The fourth power source 84 may be capable of applying a negative voltage to the reflector 33.

The first to the fourth power sources 81 to 84 can apply different voltages to the collimating units 31A, 31B, and 31C and the reflector 33, respectively. The first to the fourth power sources 81 to 84 can apply the same voltage to the collimating units 31A, 31B, and 31C and the reflector 33, respectively. The first to the fourth power sources 81 to 84 applies a voltage of 0 to 1000 V, for example, to the collimating units 31A, 31B, and 31C and the reflector 33, respectively.

The third power supply device 63 according to the present embodiment includes the first to the fourth power sources 81 to 84. The third power supply device 63 may include one power source and a plurality of variable resistors, for example. The power source and the variable resistors serve as a voltage dividing circuit and can apply different voltages to the collimating units 31A, 31B, and 31C and the reflector 33. In this case, a terminal of the voltage dividing circuit connected to the collimating unit 31A is an example of the first applying unit. A terminal of the voltage dividing circuit connected to the collimating unit 31B is an example of the first applying unit and the second applying unit. A terminal of the voltage dividing circuit connected to the collimating unit 31C is an example of the second applying unit.

Figure 4:
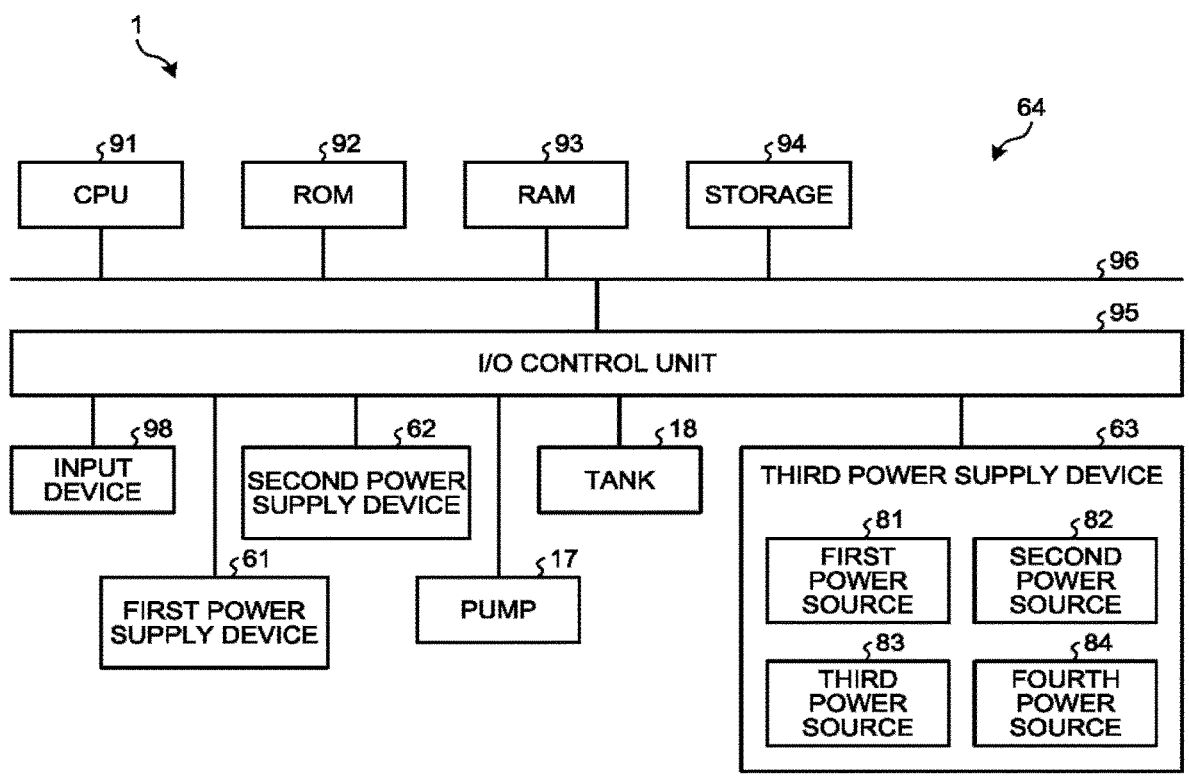
FIG. 4 is a block diagram of an exemplary hardware configuration of the sputtering apparatus according to the first embodiment.

FIG. 4 is a block diagram of an exemplary hardware configuration of the sputtering apparatus 1 according to the first embodiment. As illustrated in FIG. 4, the control device 64 includes a CPU (central processing unit) 91, a ROM (read only memory) 92, a RAM (random access memory) 93, a storage 94, and an I/O control unit 95 connected to one another via a bus 96. The control device 64 has a hardware configuration using a typical computer. The control device 64 may be connected to a server via a network.

The CPU 91 is an arithmetic unit that controls the entire processing of the sputtering apparatus 1. The RAM 93 stores therein data necessary for various kinds of processing performed by the CPU 91. The ROM 92 stores therein computer programs or the like, such as BIOS. The storage 94 is an HDD (hard disk drive), for example, and stores therein computer programs or the like for enabling the CPU 91 to perform the various kinds of processing.

The I/O control unit 95 connects an input device 98, the pump 17, the tank 18, the first power supply device 61, the second power supply device 62, and the third power supply device 63 to the CPU 91. The input device 98 is a keyboard, a mouse, or a touch panel, for example.

The computer program for causing the sputtering apparatus 1 according to the present embodiment to perform the various kinds of processing is embedded and provided in the ROM 92 or the storage 94, for example. The CPU 91 reads and executes the computer program, thereby loading and generating various functional components on the main memory. The control device 64 controls the pump 17, the tank 18, and the first to the third power supply devices 61 to 63 based on the functional components, for example.

The sputtering apparatus 1 is one apparatus having the configuration described above. The control device 64 may be a PC (personal computer) to which various peripheral devices are connected, for example.

The computer program performed by the sputtering apparatus 1 according to the present embodiment may be recorded and provided in a computer-readable recording medium, such as a CD-ROM, a flexible disk (FD), a CD-R, and a DVD (digital versatile disc), as an installable or executable file.

The computer program performed by the sputtering apparatus 1 according to the present embodiment may be stored in a computer connected to a network, such as the Internet, and provided by being downloaded via the network. Furthermore, the computer program performed by the sputtering apparatus 1 according to the present embodiment may be provided or distributed via a network, such as the Internet.

The sputtering apparatus 1 performs magnetron sputtering as described below, for example. The method for performing magnetron sputtering by the sputtering apparatus 1 is not limited to the method described below.

The pump 17 illustrated in FIG. 1 sucks gas in the processing chamber 11a from the outlet 24. As a result, air in the processing chamber 11a is removed, thereby reducing the air pressure in the processing chamber 11a. The pump 17 evacuates the processing chamber 11a.

Subsequently, the tank 18 causes argon gas to enter into the processing chamber 11a from the inlet 25. When the first power supply device 61 applies a voltage to the target 12, the plasma P is generated near the magnetic field of the magnet 14. The second power supply device 62 may also apply a voltage to the stage 13.

The lower surface 12a of the target 12 is sputtered by ions, whereby the particles C are ejected from the lower surface 12a of the target 12 to the semiconductor wafer 2. The particles C according to the present embodiment include copper ions. The copper ions are positively charged. As described above, the directions in which the particles C fly are distributed according to the cosine law. The arrows in FIG. 3 schematically indicate the distribution of the directions in which the particles C fly.

Figure 5:
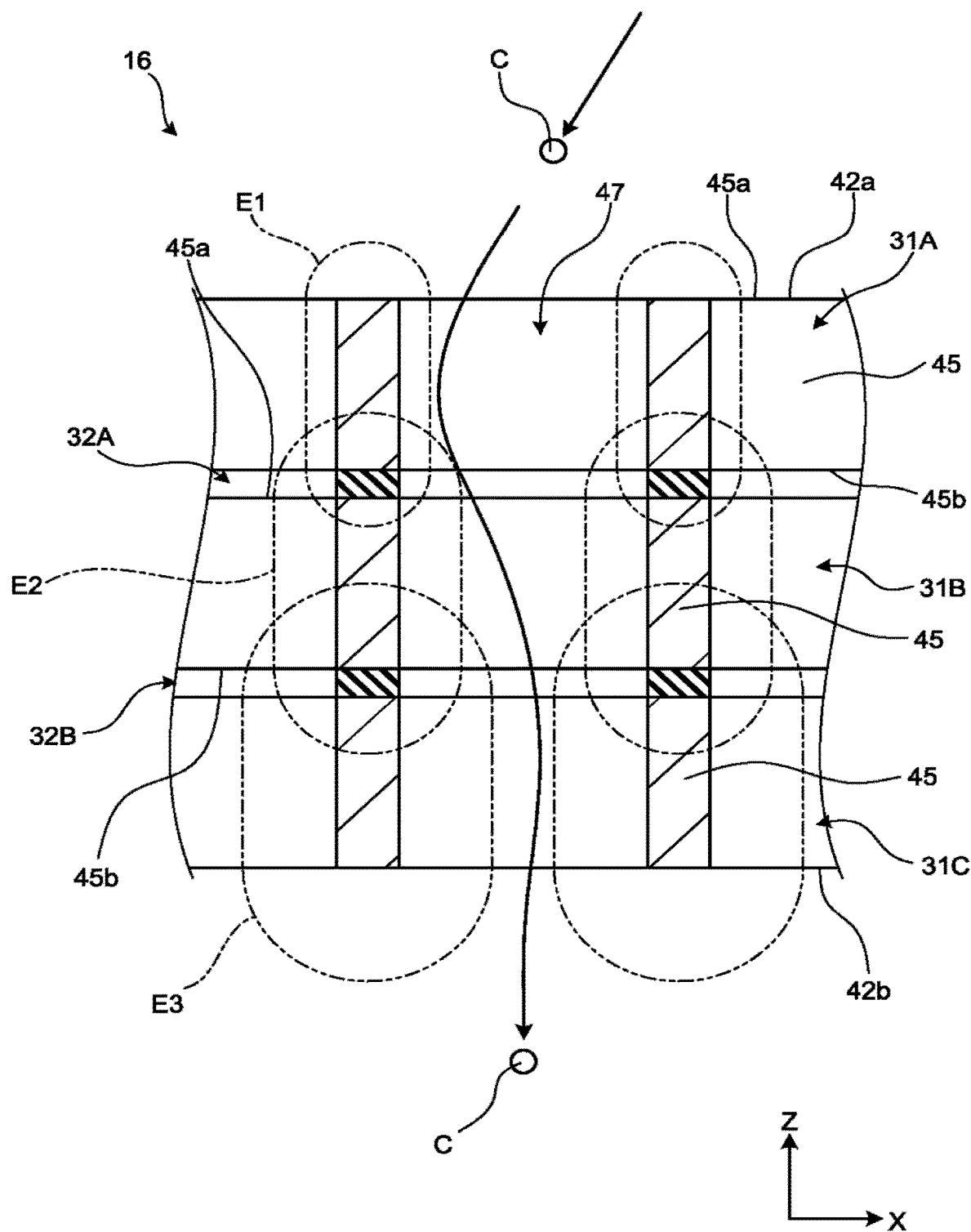
FIG. 5 is a sectional view schematically illustrating part of the collimator according to the first embodiment.

FIG. 5 is a sectional view schematically illustrating part of the collimator 16 according to the first embodiment. The first to the third power sources 81 to 83 apply positive voltages to the collimating units 31A, 31B, and 31C, respectively. In other words, the first to the third power sources 81 to 83 apply voltages having the same polarity as that of electric charges in the copper ions serving as the particles C to the collimating units 31A, 31B, and 31C, respectively.

The walls 45 of the collimating unit 31A to which the positive voltage is applied generate a first electric field E1. The walls 45 of the collimating unit 31B to which the positive voltage is applied generate a second electric field E2. The walls 45 of the collimating unit 31C to which the positive voltage is applied generate a third electric field E3. The frames 41 of the collimating units 31A, 31B, and 31C also generate the first to the third electric fields E1 to E3, respectively.

The voltage applied to the collimating unit 31B is higher than that applied to the collimating unit 31A. As a result, the electric filed intensity of the second electric field E2 is higher than that of the first electric filed E1. The voltage applied to the collimating unit 31C is higher than that applied to the collimating unit 31B. As a result, the electric filed intensity of the third electric field E3 is higher than that of the second electric filed E2. FIG. 5 schematically illustrates the first to the third electric fields E1 to E3 by two-dot chain lines in accordance with the electric field intensities of the first to the third electric fields E1 to E3. The first to the third electric fields E1 to E3 form through holes define by the electric fields having the sectional area decreasing as they extend from the upper wall 21 to the stage 13.

The particles C ejected in the vertical direction pass through the through holes 47 of the three collimating units 31 and the two intervening members 32 connected to each other and fly toward the semiconductor wafer 2 supported by the stage 13. Some particles C are ejected in directions (oblique directions) obliquely intersecting the vertical direction. The particles C having the angle between the oblique direction and the vertical direction larger than a predetermined range fly toward the walls 45.

The particles C serving as positively charged ions receive repulsion from the first to the third electric fields E1 to E3. The repulsion acting on the particles C according to the present embodiment increases from the collimating unit 31A to the collimating unit 31C.

The repulsion of the first to the third electric fields E1 to E3 acting on the particles C moves the particles C toward the central axis of the through holes 47. As a result, as illustrated in FIG. 5, the particles C serving as ions are moved away from the walls 45 by the repulsion of the first to the third electric fields E1 to E3 and converged to the center of the through holes 47. In other words, the particles C serving as ions are reflected by the walls 45 because of the first to the third electric fields E1 to E3 and pass through the through holes 47. The particles C passing through the through holes 47 fly toward the semiconductor wafer 2.

The particles C ejected from the target 12 can include electrically neutral copper atoms and copper molecules. The particles C that are electrically neutral and have the angle between the oblique direction and the vertical direction larger than the predetermined range may possibly adhere to the walls 45. In other words, the collimator 16 blocks the particles C having the angle between the oblique direction and the vertical direction out of the predetermined range. The particles C flying in the oblique direction may possibly adhere to the shielding member 15.

The particles C having the angle between the oblique direction and the vertical direction within the predetermined range pass through the through holes 47 of the collimator 16 and fly toward the semiconductor wafer 2 supported by the stage 13. The particles C having the angle between the oblique direction and the vertical direction within the predetermined range may possibly receive the repulsion from the first to the third electric fields E1 to E3 or adhere to the walls 45.

Figure 6:
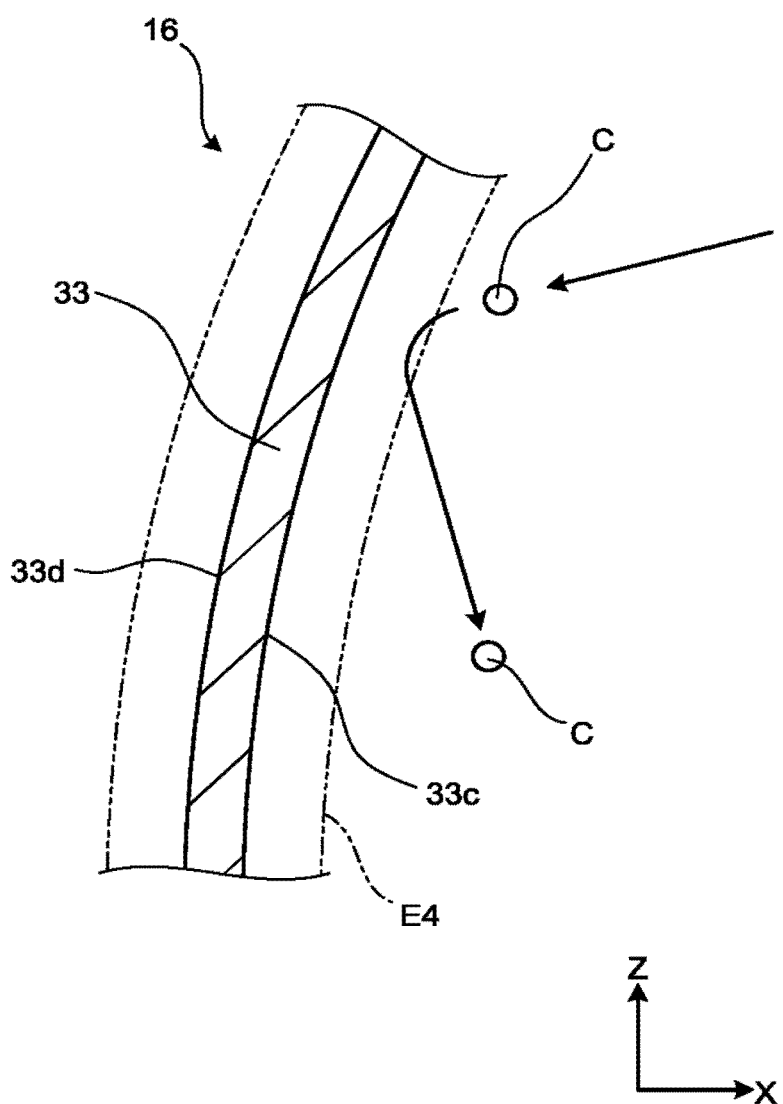
FIG. 6 is a sectional view schematically illustrating part of a reflector according to the first embodiment.

FIG. 6 is a sectional view schematically illustrating part of the reflector 33 according to the first embodiment. The fourth power source 84 applies a positive voltage to the reflector 33. In other words, the fourth power source 84 applies a voltage having the same polarity as that of the electric charges in the copper ions serving as the particles C to the reflector 33. The reflector 33 to which the positive voltage is applied generates a fourth electric field E4.

The particles C having the angle between the oblique direction and the vertical direction larger than the predetermined range may possibly fly toward the reflector 33. The particles C serving as positively charged ions receive repulsion from the fourth electric field E4.

The repulsion of the fourth electric field E4 acting on the particles C moves the particles C in a direction away from the reflector 33. As a result, as illustrated in FIG. 6, the direction in which the particles C serving as ions fly is bent toward the semiconductor wafer 2 placed on the stage 13 by the repulsion of the fourth electric field E4. In other words, the particles C serving as ions are reflected by the reflector 33 because of the fourth electric field E4 and fly toward the stage 13. The particles C flying toward the stage 13 pass through the through holes 47 of the three collimating units 31 and the two intervening members 32, for example, and fly toward the semiconductor wafer 2.

As described above, the inner peripheral surface 33c of the reflector 33 is a curved surface recessed with respect to the stage 13. The inner peripheral surface 33c is a recessed paraboloid of revolution, for example. Because the fourth electric field E4 is generated along the inner peripheral surface 33c, the reflector 33 can reflect the particles C by means of the fourth electric field E4 in the direction along the Z-axis or a direction close thereto. The inner peripheral surface 33c may have another shape that can reflect the particles C flying toward the inner peripheral surface 33c in the direction along the Z-axis.

The particles C that are electrically neutral and have the angle between the oblique direction and the vertical direction larger than the predetermined range may possibly adhere to the reflector 33. In other words, the reflector 33 blocks the particles C having the angle between the oblique direction and the vertical direction out of the predetermined range.

The particles C passing through the through holes 47 of the collimator 16 adhere to and accumulate on the semiconductor wafer 2, thereby being deposited on the semiconductor wafer 2. In other words, the semiconductor wafer 2 receives the particles C ejected from the target 12. The angles (directions) of the particles C passing through the through holes 47 are aligned within the predetermined range with respect to the vertical direction. As described above, the directions of the particles C to be deposited on the semiconductor wafer 2 are controlled by the shape of the collimator 16.

The magnet 14 moves until the thickness of the film of the particles C deposited on the semiconductor wafer 2 reaches a desired thickness. Movement of the magnet 14 causes the plasma P to move, thereby uniformly shaving the target 12.

The electric field intensities of the first to the fourth electric fields E1 to E4 are set based on various conditions, such as the material of the target 12. The control device 64, for example, sets the electric field intensities of the first to the fourth electric fields E1 to E4 based on conditions received by the input device 98. Information on the electric field intensities of the first to the fourth electric fields E1 to E4 based on the received conditions may be stored in the storage 94. Alternatively, the CPU 91 may calculate the electric field intensities of the first to the fourth electric fields E1 to E4 based on the received conditions. Still alternatively, a user of the sputtering apparatus 1 may set the electric field intensities of the first to the fourth electric fields E1 to E4 using the input device 98.

The electric field intensities of the first to the fourth electric fields E1 to E4 may be changed during sputtering. The control device 64, for example, may control the first to the fourth power sources 81 to 84 to change the electric field intensities of the first to the fourth electric fields E1 to E4, respectively, as the thickness of the film deposited on the semiconductor wafer 2 increases.

The collimator 16 according to the present embodiment is additively manufactured by a three-dimensional printer, for example. With this technique, the collimator 16 including the three collimating units 31, the two intervening members 32, the reflector 33, the first gasket 34, and the second gasket 35 can be manufactured in a simpler manner. The manufacturing method is not limited thereto, and the collimator 16 may be manufactured by other methods.

The three collimating units 31, the two intervening members 32, the reflector 33, the first gasket 34, and the second gasket 35 of the collimator 16 are fixed to each other. The three collimating units 31, the two intervening members 32, the reflector 33, the first gasket 34, and the second gasket 35 of the collimator 16 may be integrally formed, for example. The three collimating units 31, the two intervening members 32, the reflector 33, the first gasket 34, and the second gasket 35 of the collimator 16 may be bonded to each other, for example.

The three collimating units 31, the two intervening members 32, the reflector 33, the first gasket 34, and the second gasket 35 of the collimator 16 may be separable from each other. The three collimating units 31, the two intervening members 32, the reflector 33, the first gasket 34, and the second gasket 35 that are individual parts are stacked on each other, for example. In this case, the three collimating units 31, the two intervening members 32, the reflector 33, the first gasket 34, and the second gasket 35 can be manufactured in a simpler manner.

In the sputtering apparatus 1 according to the first embodiment, the third power supply device 63 applies voltages having the same polarity as that of electric charges in the particles C to the three collimating units 31 and the reflector 33. When the particles C are ejected from the target 12 toward the three collimating units 31 and the reflector 33, repulsion is generated between the particles C and the three collimating units 31 or the reflector 33. This mechanism suppresses adhesion of the particles C to the collimator 16, thereby making the particles C more likely to reach the semiconductor wafer 2. Consequently, reduction in the use efficiency of the particles C is suppressed. In other words, the number of particles C that fail to reach the semiconductor wafer 2 can be reduced.

The collimator 16 includes the three collimating units 31A, 31B, and 31C. The third power supply device 63 can apply different voltages to the collimating units 31A, 31B, and 31C. The voltage applied to the collimating unit 31B, for example, is set higher than that applied to the collimating unit 31A. In this case, greater repulsion acts on the particles C as they fly from the through holes 47 of the collimating unit 31A to the through holes 47 of the collimating unit 31B. As a result, the particles C are moved toward the center of the through holes 47 of the collimating unit 31B. This mechanism suppresses reduction in the use efficiency of the particles C and fluctuation in the distribution of the particles C adhering to the semiconductor wafer 2. The voltage applied to the collimating unit 31A and the voltage applied to the collimating unit 31B are not limited thereto, and the voltage applied to the collimating unit 31A may be higher than that applied to the collimating unit 31B. Alternatively, the voltage applied to the collimating unit 31A may be equal to that applied to the collimating unit 31B. By controlling the voltages applied to the three collimating units 31, reduction in the use efficiency of the particles C can be suppressed.

The insulating intervening members 32A and 32B are disposed between the three collimating units 31A, 31B, and 31C. This structure suppresses electrical connection between the three collimating units 31A, 31B, and 31C, thereby enabling application of different voltages to the three collimating units 31A, 31B, and 31C.

The intervening members 32A and 32B each include a plurality of walls 45 and have a plurality of through holes 47. The through holes 47 of the three collimating units 31 are connected to the respective through holes 47 of the two intervening members 32A and 32B. In other words, the three collimating units 31 and the two intervening members 32 serve as one collimator. This structure suppresses electrical connection between the three collimating units 31A, 31B, and 31C. In addition, the three collimating units 31 and the two intervening members 32 can block the particles C that obliquely fly and are electrically neutral.

The three collimating units 31A, 31B, and 31C and the two intervening members 32A and 32B are fixed to each other. This structure suppresses a change in the use efficiency of the particles C caused by misalignment of the through holes 47 between the three collimating units 31 and the two intervening members 32.

The reflector 33 has the inner peripheral surface 33c covering at least part of the upper wall 21 and facing obliquely downward between the direction along the Z-axis and the direction along the X-axis or the Y-axis. The third power supply device 63 applies a voltage having the same polarity as that of electric charges in the particles C to the reflector 33. When the obliquely ejected particles C fly toward the reflector 33, repulsion is generated between the particles C and the reflector 33. Because the inner peripheral surface 33c faces obliquely downward, the particles C reflected by the reflector 33 because of the repulsion fly toward the stage 13. This mechanism makes the particles C more likely to reach the semiconductor wafer 2, thereby suppressing reduction in the use efficiency of the particles C.

The inner peripheral surface 33c of the reflector 33 is a curved surface recessed with respect to the stage 13. With this structure, the directions in which the particles C are reflected from the reflector 33 by the repulsion are more likely to be directed toward the stage 13. The inner peripheral surface 33c is a recessed paraboloid of revolution that can reflect the particles C flying toward the inner peripheral surface 33c in the direction along the Z-axis, for example. Consequently, the particles C are more likely to reach the semiconductor wafer 2, thereby suppressing reduction in the use efficiency of the particles C.

The collimator 16 according to the first embodiment described above includes the three collimating units 31. The collimator 16 may include two collimating units 31 or three or more collimating units 31.

Figure 7:
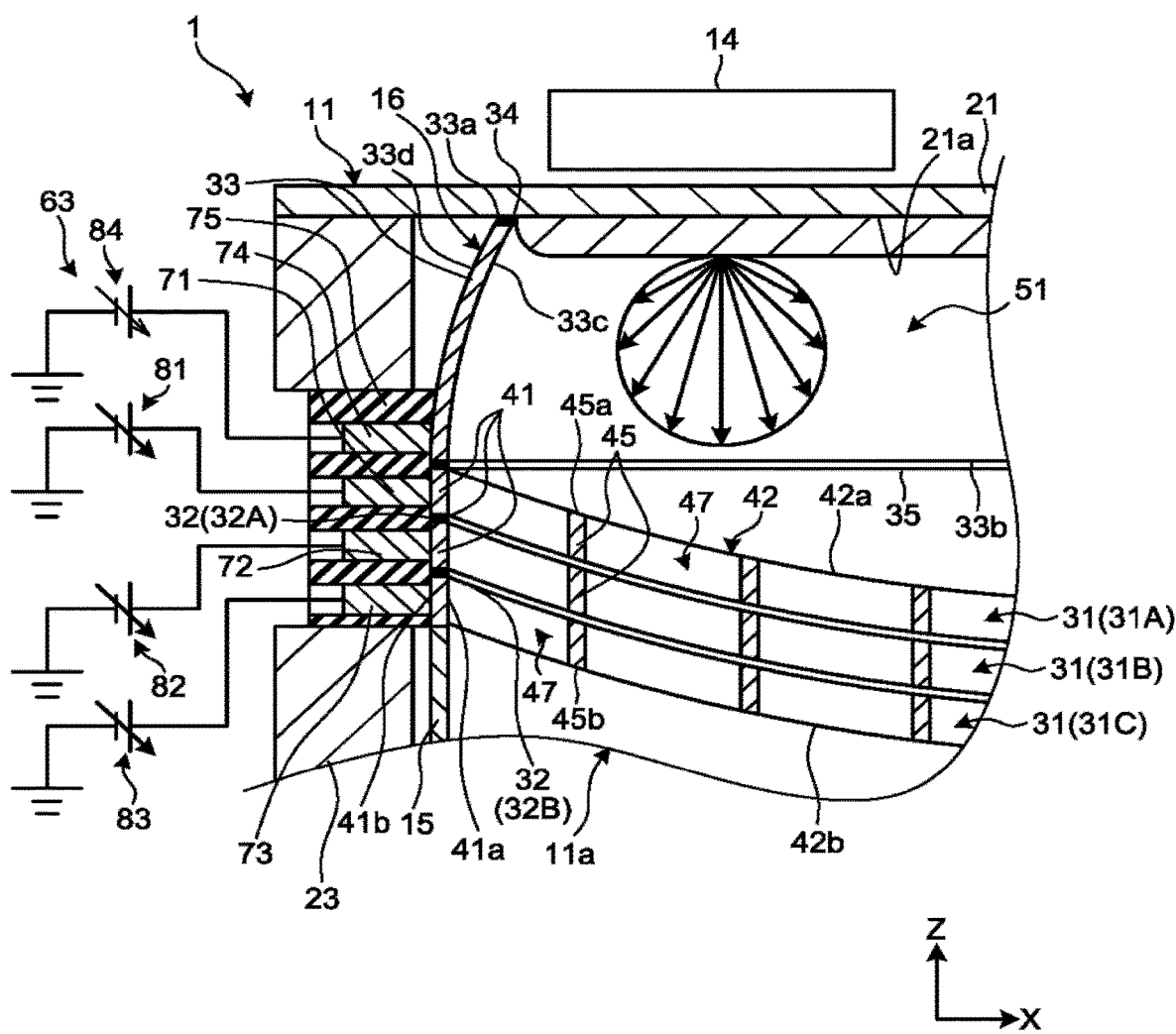
FIG. 7 is a sectional view of part of the sputtering apparatus according to a modification of the first embodiment.

FIG. 7 is a sectional view of part of the sputtering apparatus 1 according to a modification of the first embodiment. As illustrated in FIG. 7, the two intervening members 32 each include the frame 41 but do not necessarily include the flow rectifying unit 42. In other words, the two intervening members 32 may each have a ring shape.

The three collimating units 31 and the two ring-shaped intervening members 32 are individual parts. The three collimating units 31 and the two ring-shaped intervening members 32 are stacked, for example. With this structure, the collimator 16 can be formed in a simpler manner.

A second embodiment is described below with reference to FIG. 8. In the following description of a plurality of embodiments, components having functions similar to those of previously described components are denoted by the same reference numerals as those of the previously described components, and explanation thereof may possibly be omitted. All the functions and properties of a plurality of components denoted by the same reference numeral are not necessarily the same. The components may have different functions and properties according to the respective embodiments.

Figure 8:
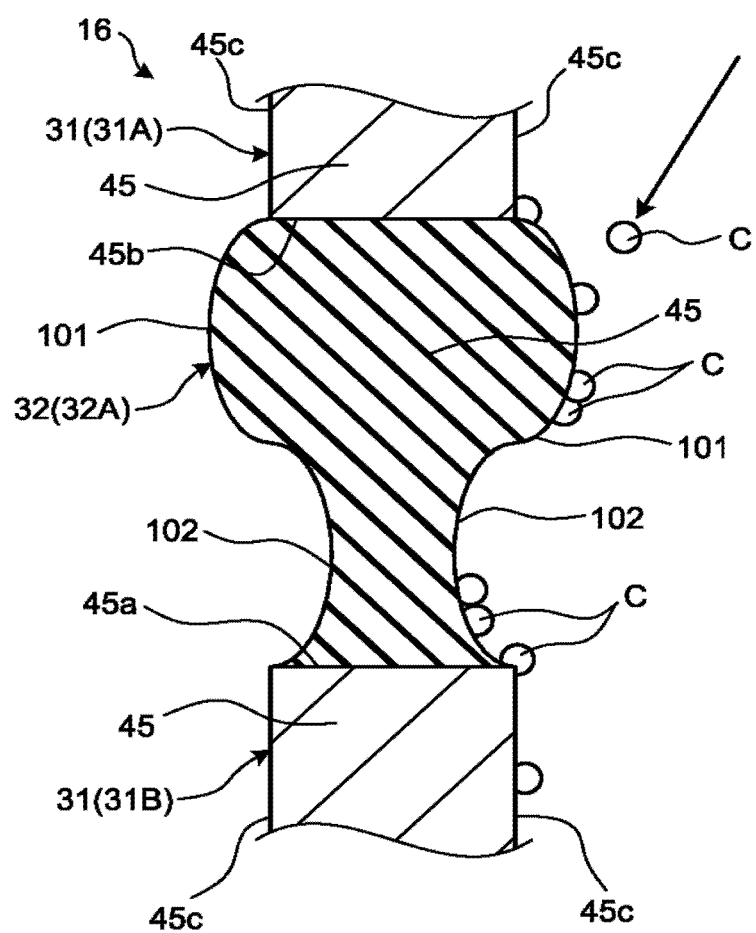
FIG. 8 is a sectional view of part of the collimator according to a second embodiment.

FIG. 8 is a sectional view of part of the collimator 16 according to the second embodiment. As illustrated in FIG. 8, the wall 45 of the collimating unit 31 has two inner surfaces 45c. The inner surfaces 45c form the through holes 47. In other words, the inner surfaces 45c face the through holes 47. In one wall 45, one inner surface 45c is positioned opposite to the other inner surface 45c. The inner surface 45c of the collimating unit 31A is an example of a first inner surface. The inner surface 45c of the collimating unit 31B is an example of a second inner surface.

A lower end surface 45b of the wall 45 of the collimating unit 31A faces an upper end surface 45a of the wall 45 of the collimating unit 31B. The lower end surface 45b of the wall 45 of the collimating unit 31A is an example of a first end surface. The upper end surface 45a of the wall 45 of the collimating unit 31B is an example of a second end surface. The intervening member 32A is disposed between the lower end surface 45b of the wall 45 of the collimating unit 31A and the upper end surface 45a of the wall 45 of the collimating unit 31B.

The wall 45 of the intervening member 32 forms a protrusion 101 and a recess 102. The wall 45 of the intervening member 32 may have only one of the protrusion 101 and the recess 102. One of the intervening members 32A and 32B may form at least one of the protrusion 101 and the recess 102.

The protrusion 101 protrudes from the inner surface 45c of the wall 45 of the collimating unit 31 to which the wall 45 of the intervening member 32 is fixed in a direction in which the inner surface 45c faces. The protrusion 101 of the intervening member 32A, for example, protrudes from the inner surface 45c of the wall 45 of the collimating unit 31A or 31B in a direction in which the inner surface 45c faces. The surface of the protrusion 101 is a curved surface.

The recess 102 is recessed from the inner surface 45c of the wall 45 of the collimating unit 31 to which the wall 45 of the intervening member 32 is fixed in a direction in which the inner surface 45c faces. The recess 102 of the intervening member 32A, for example, is recessed from the inner surface 45c of the wall 45 of the collimating unit 31A or 31B in a direction in which the inner surface 45c faces. The surface of the recess 102 is a curved surface.

The protrusion 101 and the recess 102 are smoothly connected. In other words, the protrusion 101 and the recess 102 continuously extends with no acute-angled portion. The protrusion 101 is closer to the upper wall 21 than the recess 102 in the direction along the Z-axis.

The particles C having the angle between the oblique direction and the vertical direction larger than the predetermined range may possibly adhere to the wall 45 of the intervening member 32. A portion of the protrusion 101 facing the stage 13 is hidden from the target 12, and the particles C are less likely to adhere to the portion. A portion of the recess 102 facing the stage 13 is hidden from the target 12, and the particles C are less likely to adhere to the portion.

In the sputtering apparatus 1 according to the second embodiment, the walls 45 of the intervening members 32 each forms at least one of the protrusion 101 and the recess 102. The protrusion 101 protrudes from the inner surface 45c of the wall 45 of the collimating unit 31, and the recess 102 is recessed from the inner surface 45c. In a case where the intervening members 32 form the protrusion 101, the particles C ejected from the target 12 adhere to a portion of the protrusion 101 closer to the target 12 but are less likely to adhere to a portion of the protrusion 101 farther from the target 12. In a case where the intervening members 32 form the recess 102, the particles C ejected from the target 12 adhere to a portion of the recess 102 farther from the target 12 but are less likely to adhere to a portion of the recess 102 closer to the target 12. As described above, the walls 45 of the intervening members 32 have the portions to which the particles C are less likely to adhere, thereby suppressing electrical connection between the three collimating units 31 by the particles C.

Figure 9:
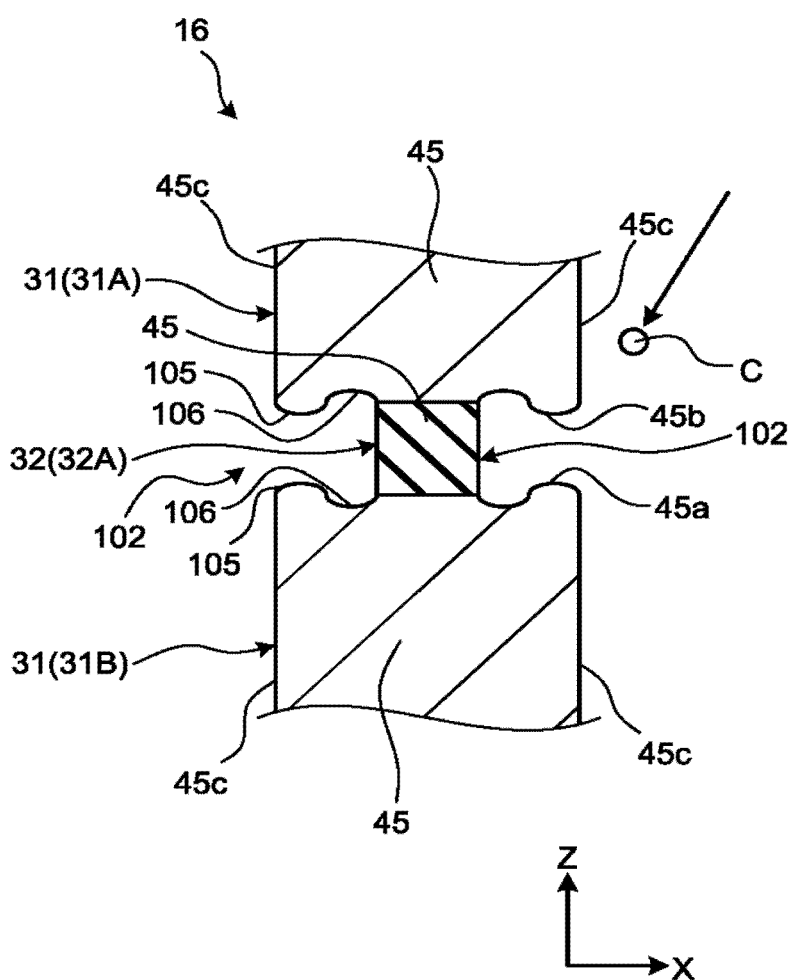
FIG. 9 is a sectional view of part of the collimator according to a third embodiment.

A third embodiment is described below with reference to FIG. 9. FIG. 9 is a sectional view of part of the collimator 16 according to the third embodiment. As illustrated in FIG. 9, the wall 45 of the intervening member 32 according to the third embodiment is positioned between one inner surface 45c and the other inner surface 45c of the wall 45 of the collimating unit 31 to which the wall 45 of the intervening member 32 is fixed in a direction in which the inner surface 45c of the wall 45 of the collimating unit 31 faces.

The wall 45 of the intervening member 32A, for example, is positioned between one inner surface 45c and the other inner surface 45c of the wall 45 of the collimating unit 31A. Furthermore, the wall 45 of the intervening member 32A is positioned between one inner surface 45c and the other inner surface 45c of the wall 45 of the collimating unit 31B. In other words, the thickness of the wall 45 of the intervening member 32 is thinner than that of the wall 45 of the collimating unit 31.

Because the wall 45 of the intervening member 32 is positioned between one inner surface 45c and the other inner surface 45c of the wall 45 of the collimating unit 31, the wall 45 of the intervening member 32 forms the recess 102. The recess 102 according to the third embodiment is composed of the wall 45 of the intervening member 32A, the lower end surface 45b of the wall 45 of the collimating unit 31A, and the upper end surface 45a of the wall 45 of the collimating unit 31B, for example.

In a direction in which the inner surface 45c of the wall 45 of the collimating unit 31 faces, at least one of the upper end surface 45a and the lower end surface 45b of the wall 45 of the collimating unit 31 has a protruding surface 105 and a recessed surface 106. The protruding surface 105 is an example of a curved surface.

The lower end surface 45b of the wall 45 of the collimating unit 31A, for example, has the protruding surface 105 and the recessed surface 106. The protruding surface 105 is closer to the inner surface 45c than the recessed surface 106. The protruding surface 105 of the lower end surface 45b of the collimating unit 31A is a curved surface protruding toward the upper end surface 45a of the wall 45 of the collimating unit 31B. The recessed surface 106 is a curved surface recessed with respect to the upper end surface 45a of the wall 45 of the collimating unit 31B.

The upper end surface 45a of the wall 45 of the collimating unit 31B also has the protruding surface 105 and the recessed surface 106. The protruding surface 105 is closer to the inner surface 45c than the recessed surface 106. The protruding surface 105 of the upper end surface 45a of the collimating unit 31B is a curved surface protruding toward the lower end surface 45b of the wall 45 of the collimating unit 31A. The recessed surface 106 is a curved surface recessed with respect to the lower end surface 45b of the wall 45 of the collimating unit 31A. The upper end surface 45a of the wall 45 of the collimating unit 31B does not necessarily have the protruding surface 105 or the recessed surface 106, for example, and may be flat.

The protruding surface 105 of the lower end surface 45b of the collimating unit 31A faces the protruding surface 105 of the upper end surface 45a of the collimating unit 31B. The recessed surface 106 of the lower end surface 45b of the collimating unit 31A faces the recessed surface 106 of the upper end surface 45a of the collimating unit 31B. As a result, the distance between the lower end surface 45b of the collimating unit 31A and the upper end surface 45a of the collimating unit 31B in the direction along the Z-axis increases from the inner surface 45c to the intervening member 32A.

A sufficient insulation distance is secured for the distance between the protruding surface 105 of the lower end surface 45b of the collimating unit 31A and the protruding surface 105 of the upper end surface 45a of the collimating unit 31B. In other words, the distance between the protruding surface 105 of the lower end surface 45b of the collimating unit 31A and the protruding surface 105 of the upper end surface 45a of the collimating unit 31B is set to a distance that suppresses dielectric breakdown.

The particles C having the angle between the oblique direction and the vertical direction larger than the predetermined range may possibly fly toward the space between the two collimating units 31. The upper end surface 45a and the lower end surface 45b of the two facing collimating units 31 each have the protruding surface 105 and the recessed surface 106. This structure increases the solid angle between the direction in which the particles C fly and the direction extending from the gap between the two facing collimating units to the intervening member 32. As a result, the particles C are less likely to adhere to the intervening member 32.

Voltages are applied to the three collimating units 31. Because the protruding surfaces 105 of the two facing collimating units 31 are curved surfaces, dielectric breakdown is less likely to occur between the two collimating units 31.

When the temperature of the collimator 16 changes with the particles C adhering to the collimator 16, the particles C adhering to the collimator 16 may possibly fall off because of stress. The protruding surface 105 and the recessed surface 106 are curved surfaces. If the particles C adhere to the protruding surface 105 and the recessed surface 106, they are less likely to fall off from the protruding surface 105 and the recessed surface 106.

The protruding surface 105 is closer to the inner surface 45c of the wall 45 than the recessed surface 106. The particles C may possibly adhere to the upper end surface 45a of the wall 45 of the collimating unit 31, for example. With the recessed surface 106, the falling-off particles C are more likely to fly toward the recessed surface 106 than to fall through the through holes 47. This structure suppresses dust of the particles C in the processing chamber 11a.

In the sputtering apparatus 1 according to the third embodiment, the lower end surface 45b of the wall 45 of the collimating unit 31A and the upper end surface 45a of the wall 45 of the collimating unit 31B facing each other each have the protruding surface 105. In other words, the lower end surface 45b of the collimating unit 31A and the upper end surface 45a of the collimating unit 31B have no acutely protruding portion that can cause dielectric breakdown. This structure suppresses dielectric breakdown between the two collimating units 31A and 31B.

Figure 10:
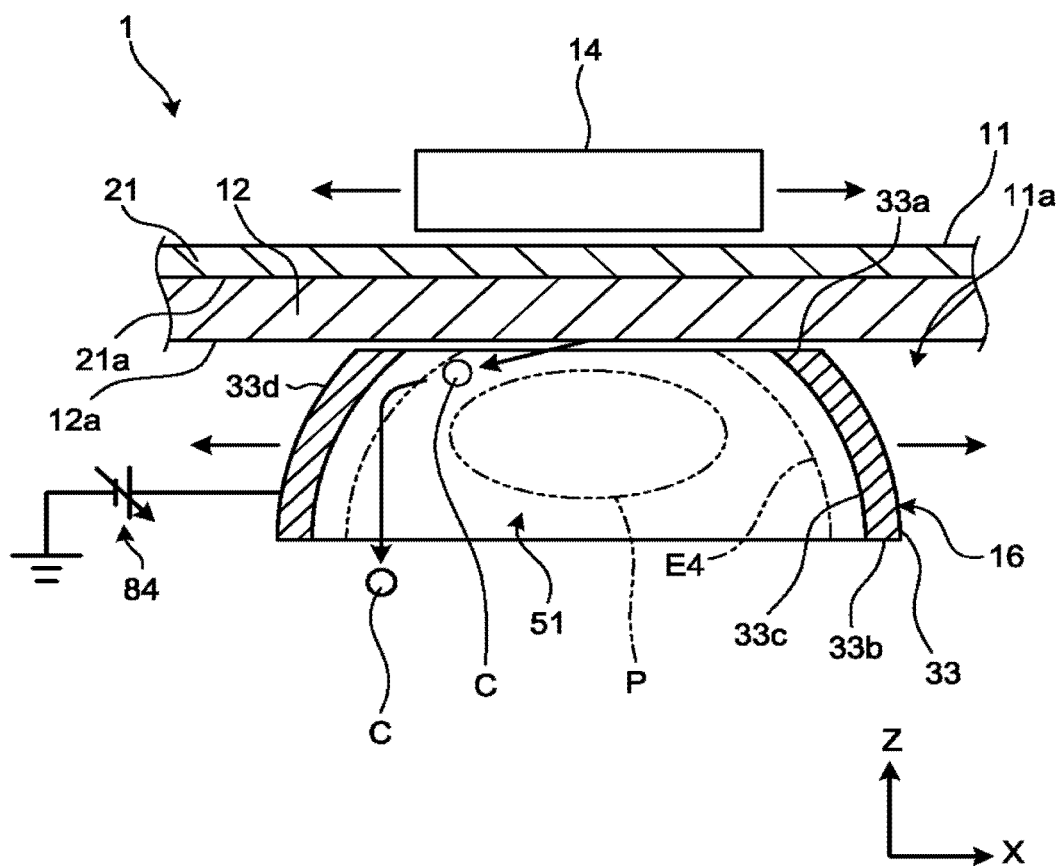
FIG. 10 is a sectional view schematically illustrating part of the sputtering apparatus according to a fourth embodiment.

A fourth embodiment is described below with reference to FIG. 10. FIG. 10 is a sectional view schematically illustrating part of the sputtering apparatus 1 according to the fourth embodiment. As illustrated in FIG. 10, the reflector 33 according to the fourth embodiment is a part provided independently of the three collimating units 31 and the two intervening members 32. The collimator 16 according to the fourth embodiment may include the reflector 33 according to the first embodiment besides the reflector 33 illustrated in FIG. 10.

The reflector 33 according to the fourth embodiment is smaller than the reflector 33 according to the first embodiment. The inside diameter of the inner peripheral surface 33c at the upper end 33a of the reflector 33 is shorter than the diameter of the target 12 on the X-Y plane. The inside diameter of the inner peripheral surface 33c at the lower end 33b of the reflector 33 is also shorter than the diameter of the target 12 on the X-Y plane.

The reflector 33 according to the fourth embodiment is positioned below the magnet 14. More specifically, the magnet 14 is positioned in the opening 51 of the reflector 33 in planar view seen in the direction along the Z-axis.

The reflector 33 moves along the upper wall 21 together with the magnet 14. The reflector 33 is moved by an actuator, for example. The reflector 33 may be moved by other means.

When a voltage is applied to the target 12 as described above, the plasma P is generated. The plasma P is generated near the magnet 14. As a result, the reflector 33 surrounds the plasma P. In other words, the plasma P is generated in the reflector 33. The particles C are ejected from a portion of the target 12 surrounded by the reflector 33.

The fourth power source 84 applies a positive voltage to the reflector 33, thereby causing the reflector 33 to generate the fourth electric field E4. The fourth electric field E4 applies repulsion to the particles C serving as ions. Because the reflector 33 surrounds the portion from which the particles C are ejected, the particles C serving as ions are more likely to be reflected by the reflector 33 and fly toward the stage 13.

Similarly to the first embodiment, the inner peripheral surface 33c of the reflector 33 is a curved surface recessed with respect to the stage 13. The inner peripheral surface 33c is a recessed paraboloid of revolution, for example. Because the fourth electric field E4 is generated along the inner peripheral surface 33c, the reflector 33 can reflect the particles C by means of the fourth electric field E4 in the direction along the Z-axis or a direction close thereto. The inner peripheral surface 33c may have another shape that can reflect the particles C flying toward the inner peripheral surface 33c in the direction along the Z-axis.

In magnetron sputtering, the plasma P is generated near the magnet 14. In the sputtering apparatus 1 according to the fourth embodiment, because the reflector 33 moves together with the magnet 14, the reflector 33 can have a size sufficiently large to surround the generated plasma P. In this case, the reflector 33 moving together with the magnet 14 continues to surround the plasma P moving together with the magnet 14. Because the reflector 33 is always disposed near the plasma P that generates the particles C, the particles C are more likely to be reflected by the reflector 33, and reduction in the use efficiency of the particles C is suppressed.

Figure 11:
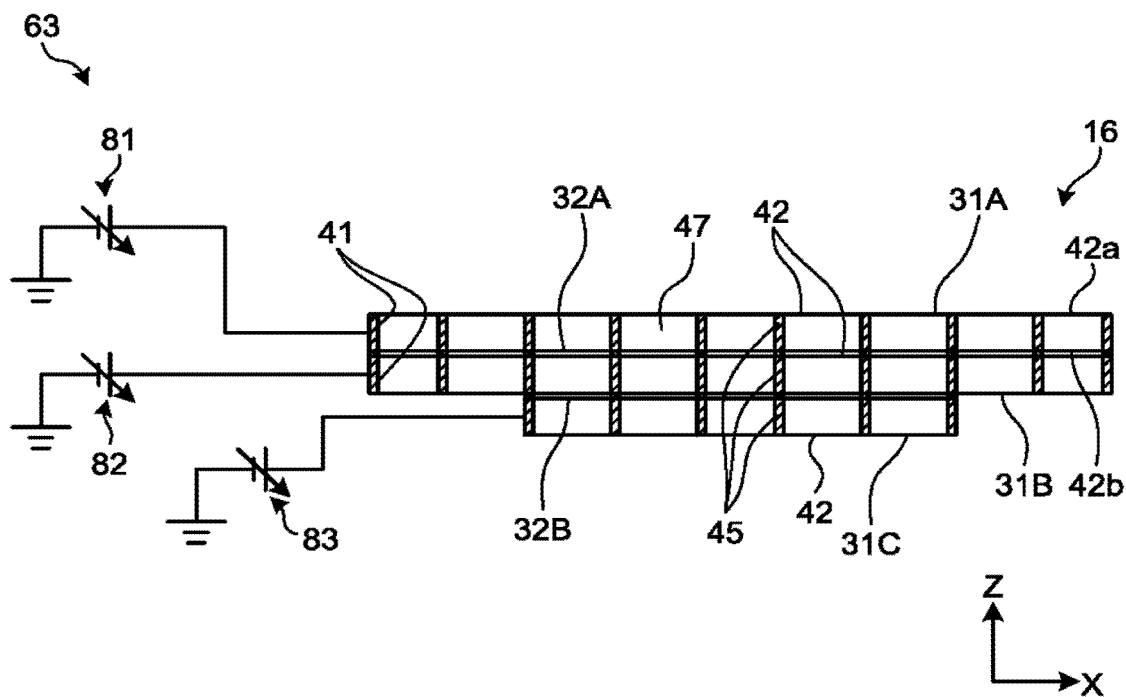
FIG. 11 is a sectional view of the collimator according to a fifth embodiment.

A fifth embodiment is described below with reference to FIGS. 11 and 12. FIG. 11 is a sectional view of the collimator 16 according to the fifth embodiment. FIG. 11 does not illustrate the reflector 33. Similarly to the first embodiment, the reflector 33 according to the fifth embodiment may be connected to the collimating unit 31A with the second gasket 35 interposed therebetween. Similarly to the fourth embodiment, the reflector 33 may be a part provided independently of the three collimating units 31 and the two intervening members 32.

As illustrated in FIG. 11, in the collimator 16 according to the fifth embodiment, the collimating unit 31C does not include the frame 41 but includes the flow rectifying unit 42. By contrast, the collimating units 31A and 31B each include the frame 41 and the flow rectifying unit 42. The intervening member 32B does not include the frame 41 but includes the flow rectifying unit 42. By contrast, the intervening member 32A includes the frame 41 and the flow rectifying unit 42.

The upper end 42a and the lower end 42b of the flow rectifying unit 42 according to the fifth embodiment are substantially flat. Similarly to the first embodiment, the upper end 42a of the flow rectifying unit 42 may be recessed like a curved surface with respect to the target 12 and the attachment surface 21a of the upper wall 21. The lower end 42b of the flow rectifying unit 42 may protrude toward the semiconductor wafer 2 supported by the stage 13 and the placement surface 13a of the stage 13.

The collimating unit 31C is smaller than the collimating unit 31A and the collimating unit 31B on the X-Y plane. In the direction along the X-axis and the direction along the Y-axis, the collimating unit 31C is positioned in the frame 41 of the collimating unit 31A and in the collimating unit 31B. In the direction along the X-axis and the direction along the Y-axis, both ends of the collimating unit 31C are apart from both ends of the collimating unit 31A and both ends of the collimating unit 31B.

Similarly to the first embodiment, the first power source 81 is electrically connected to the collimating unit 31A via the first electrode 71 in contact with the frame 41 of the collimating unit 31A. The second power source 82 is electrically connected to the collimating unit 31B via the second electrode 72 in contact with the frame 41 of the collimating unit 31B.

Figure 12:
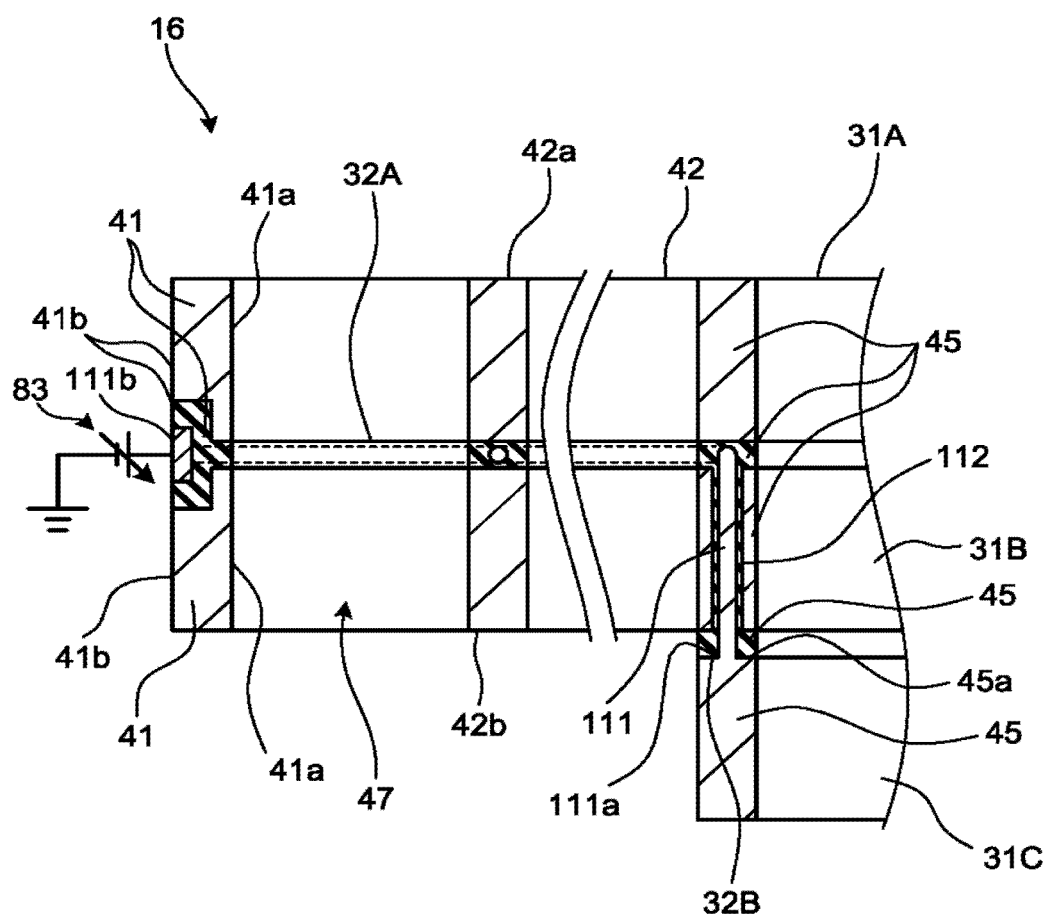
FIG. 12 is a sectional view of part of the collimator according to the fifth embodiment.

FIG. 12 is a sectional view of part of the collimator 16 according to the fifth embodiment. As illustrated in FIG. 12, the collimator 16 includes a first wire 111 and a covering portion 112. The first wire 111 may also be referred to as an electrical conductive unit, an electrical conductor, or a connecting unit, for example.

The first wire 111 is made of an electrical conductor, such as aluminum. In other words, the first wire 111 is made of the same material as that of the collimating units 31. The material of the first wire 111 may be different from that of the collimating units 31.

A first end 111a of the first wire 111 is connected to the upper end surface 45a of the wall 45 of the collimating unit 31C. A second end 111b of the first wire 111 is exposed on the outer peripheral surface 41b of the frame 41 of the intervening member 32A.

The second end 111b of the first wire 111 serves as an electrode in contact with the third electrode 73, for example. The sectional area of the second end 111b of the first wire 111 is larger than that of other parts of the first wire 111. The second end 111b of the first wire 111 is electrically insulated from the frame 41 of the collimating unit 31A by the intervening member 32A. The second end 111b of the first wire 111 is electrically insulated from the frame 41 of the collimating unit 31B by the intervening member 32A.

The first wire 111 extends through the wall 45 of the collimating unit 31B and the walls 45 of the intervening members 32A and 32B. The first wire 111 connected to the wall 45 of the collimating unit 31C, for example, passes through the wall 45 of the intervening member 32B and the wall 45 of the collimating unit 31B in the direction along the Z-axis. The first wire 111 passes through a plurality of walls 45 of the intervening member 32A and extends to the frame 41 of the intervening member 32A.

The covering unit 112 covers the first wire 111 passing through the collimating unit 31B and is interposed between the first wire 111 passing through the collimating unit 31B and the collimating unit 31B. The covering unit 112 is made of an insulating material, such as ceramics. The covering unit 112 electrically insulates the first wire 111 passing through the collimating unit 31B from the collimating unit 31B.

The third electrode 73 is in contact with the end 111b of the first wire 111. As a result, the third power source 83 is electrically connected to the collimating unit 31C via the third electrode 73 and the first wire 111. In other words, the first wire 111 electrically connects the third power source 83 and the walls 45 of the collimating unit 31C. The collimating unit 31C is an example of a second collimator according to the fifth embodiment.

In the sputtering apparatus 1 according to the fifth embodiment, the first wire 111 that connects the third power source 83 and the collimating unit 31C passes through the collimating unit 31B and the intervening members 32A and 32B. This structure suppresses an effect of the first wire 111 on generation of the plasma P in the sputtering apparatus 1, for example. In a case where the first wire 111 protrudes from the collimator 16, for example, the first wire 111 may possibly function as an electrode to prevent generation of the plasma P.

Figure 13:
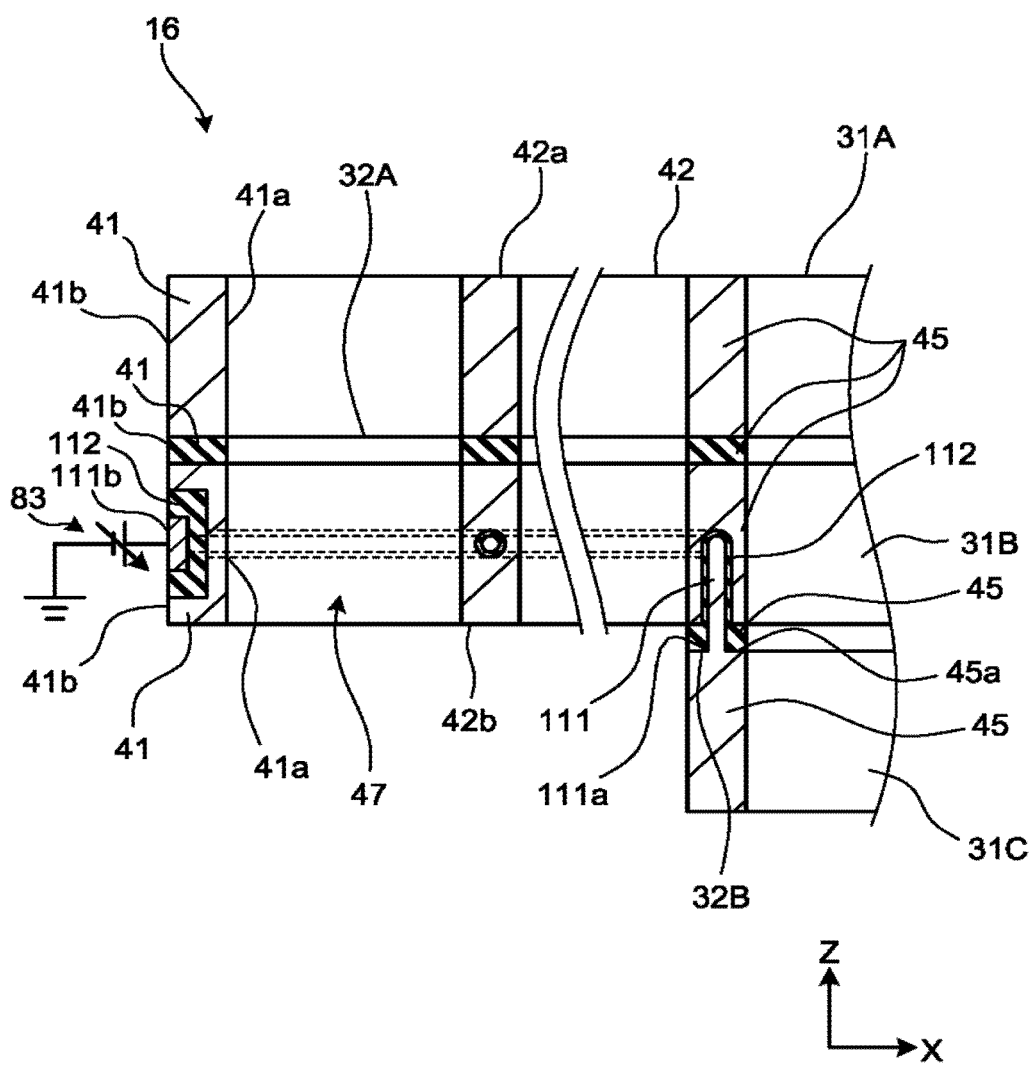
FIG. 13 is a sectional view of part of the collimator according to a modification of the fifth embodiment.

FIG. 13 is a sectional view of part of the collimator 16 according to a modification of the fifth embodiment. As illustrated in FIG. 13, the first wire 111 may pass through the collimating unit 31B and the intervening member 32B. The first wire 111 connected to the wall 45 of the collimating unit 31C, for example, passes through the wall 45 of the intervening member 32B in the direction along the Z-axis. The first wire 111 passes through a plurality of walls 45 of the collimating unit 31B and extends to the frame 41 of the collimating unit 31B.

The end 111b of the first wire 111 according to the modification of the fifth embodiment is exposed on the outer peripheral surface 41b of the frame 41 of the collimating unit 31B. The covering unit 112 electrically insulates the end 111b of the first wire 111 from the frame 41 of the collimating unit 31B.

Figure 14:
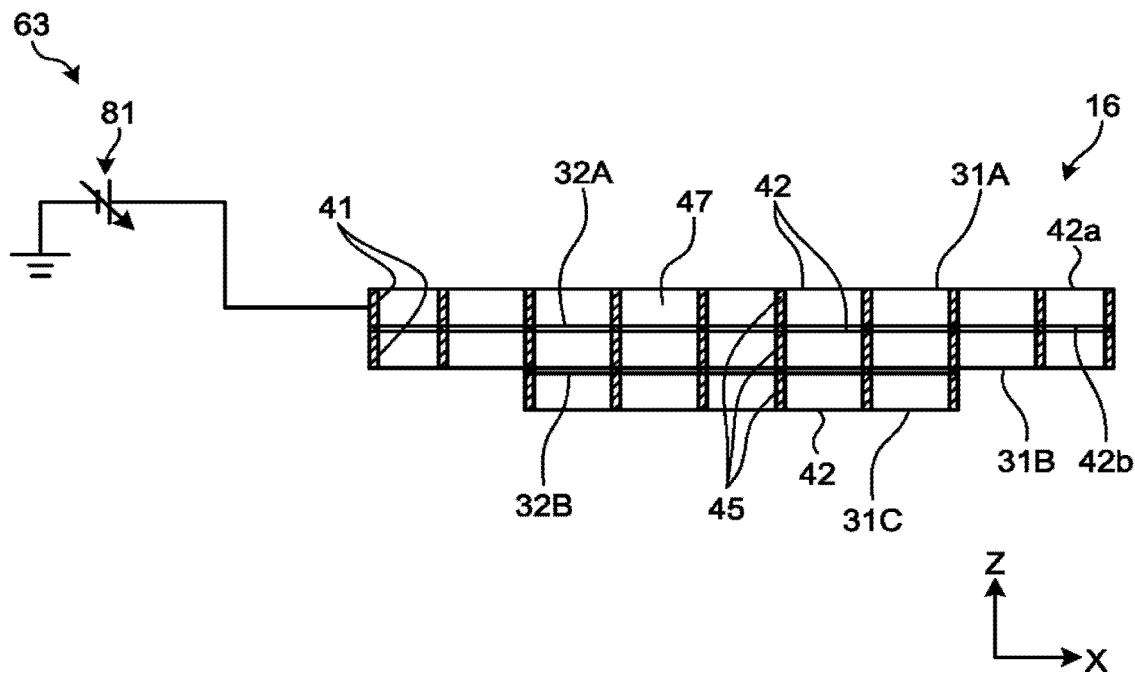
FIG. 14 is a sectional view of the collimator according to a sixth embodiment.
Figure 16:
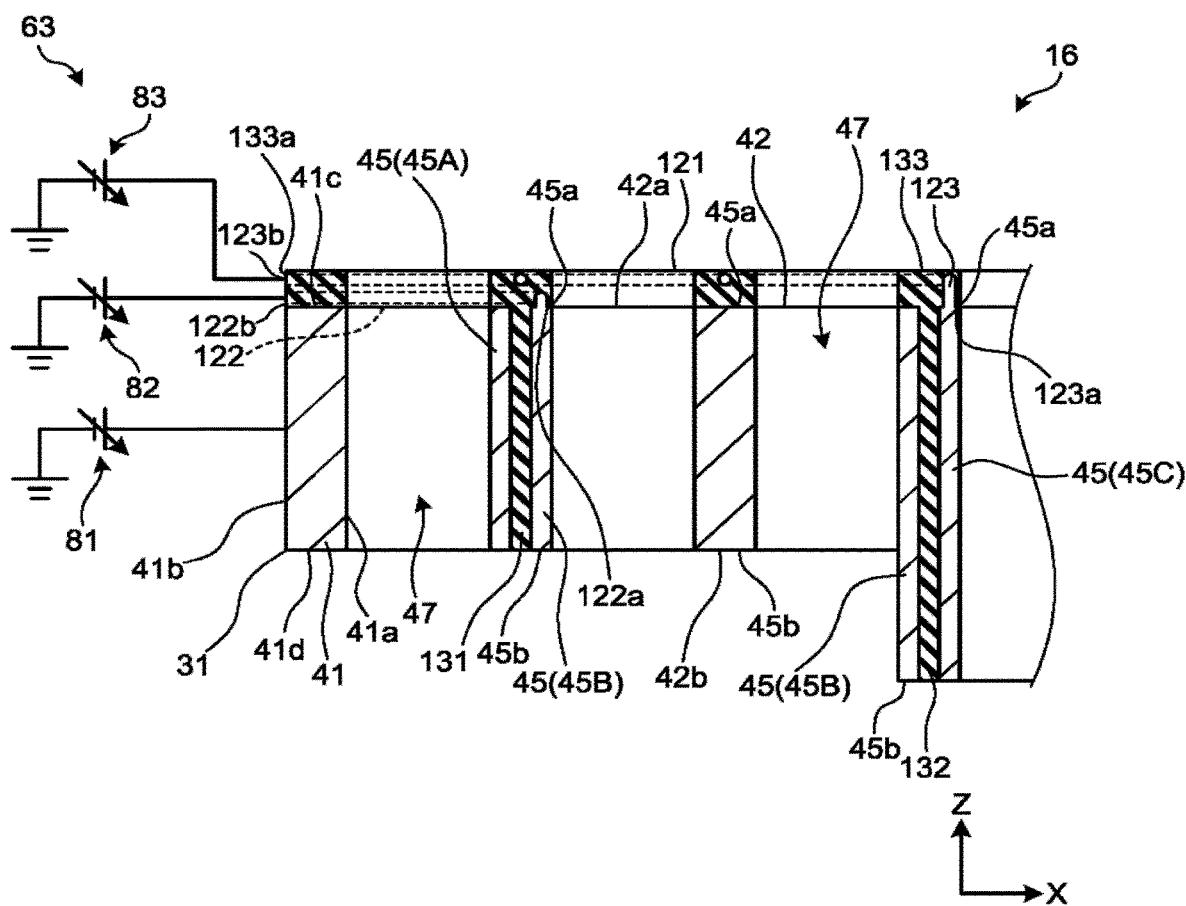
FIG. 16 is a sectional view of part of the collimator according to the seventh embodiment.

A sixth embodiment is described below with reference to FIG. 14. FIG. 14 is a sectional view of the collimator 16 according to the sixth embodiment. In FIG. 16, the intervening members 32A and 32B are electrical resistors. In other words, the intervening members 32A and 32B according to the sixth embodiment are an example of a resistor.

The intervening member 32A serving as an electrical resistor is interposed between the collimating unit 31A and the collimating unit 31B to connect the collimating unit 31A and the collimating unit 31B. The intervening member 32B serving as an electrical resistor is interposed between the collimating unit 31B and the collimating unit 31C to connect the collimating unit 31B and the collimating unit 31C. In other words, the three collimating units 31 and the two intervening members 32 are electrically connected in series.

The third power supply device 63 according to the sixth embodiment includes the first power source 81 and the fourth power source 84 but does not include the second power source 82 or the third power source 83. The first power source 81 is electrically connected to the collimating unit 31A.

The first power source 81 applies a voltage to the collimating unit 31A. As a result, a voltage is also applied to the collimating unit 31B via the intervening member 32A serving as an electrical resistor. In addition, a voltage is also applied to the collimating unit 31C via the intervening member 32A, the collimating unit 31B, and the intervening member 32B.

With the intervening members 32A and 32B serving as electrical resistors, the voltage applied to the collimating unit 31A, the voltage applied to the collimating unit 31B, and the voltage applied to the collimating unit 31C are different from one another. In other words, the first power source 81 applies different voltages to the three collimating units 31. The voltage may be applied to only the collimating unit 31B or the collimating unit 31C.

In the sputtering apparatus 1 according to the sixth embodiment, the intervening member 32A serving as an electrical resistor is provided between the collimating unit 31A and the collimating unit 31B. The third power supply device 63 applies a voltage to the collimating unit 31A. The intervening member 32A makes the voltage applied to the collimating unit 31A different from the voltage applied to the collimating unit 31B. As a result, the third power supply device 63 can apply different voltages to the three collimating units 31 without applying voltages individually to the respective three collimating units 31.

Figure 15:
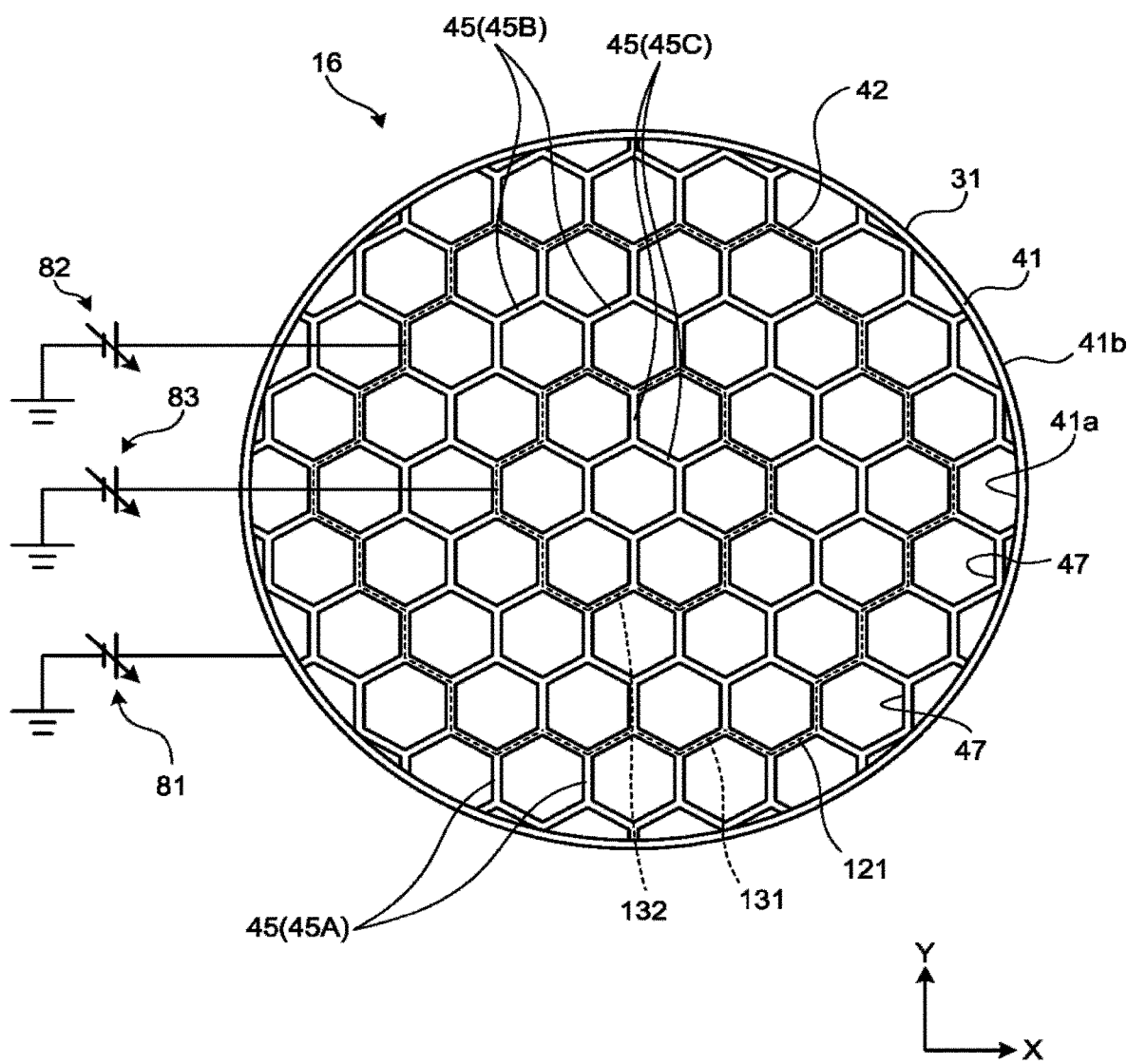
FIG. 15 is a plan view of the collimator according to a seventh embodiment.

A seventh embodiment is described below with reference to FIGS. 15 and 16. FIG. 15 is a plan view of the collimator 16 according to the seventh embodiment. FIG. 16 is a sectional view of part of the collimator 16 according to the seventh embodiment.

As illustrated in FIG. 16, the collimator 16 according to the seventh embodiment includes one collimating unit 31. The flow rectifying unit 42 of the collimating unit 31 includes a plurality of walls 45, an insulating portion 121, a second wire 122, and a third wire 123. The second wire 122 and the third wire 123 are an example of a second wire.

The walls 45 include a plurality of walls 45A, a plurality of walls 45B, and a plurality of walls 45C. The walls 45A are an example of a plurality of fourth walls and a plurality of first wall portions. The walls 45B and the walls 45C are an example of a plurality of fifth walls and a plurality of second wall portions. Similarly to the first embodiment, the walls 45 including the walls 45A, 45B, and 45C form the through holes 47. The through holes 47 formed by the walls 45A, the through holes 47 formed by the walls 45B, and the through holes 47 formed by the walls 45C are arranged in parallel. In other words, the through holes 47 formed by the walls 45A, the through holes 47 formed by the walls 45B, and the through holes 47 formed by the walls 45C are disposed on a virtual plane (X-Y plane) orthogonal to the direction in which the through holes 47 extend.

As illustrated in FIG. 15, the walls 45A are connected to one another. The walls 45B are connected to one another. The walls 45C are connected to one another. The walls 45B are positioned between the walls 45A and the walls 45C in the radial direction of the frame 41. In other words, the walls 45A are positioned on the outer side than the walls 45B and the walls 45C in the frame 41. The walls 45C are positioned on the inner side than the walls 45A and the walls 45B in the frame 41.

As described above, the walls 45A, 45B, and 45C are concentrically disposed. The walls 45A, 45B, and 45C may be disposed in a manner dividing the inside of the frame 41 into four equal parts, for example.

As illustrated in FIG. 16, the insulating portion 121 is made of an insulating material, such as ceramics. The insulating portion 121 includes a first portion 131, a second portion 132, and a third portion 133. The first to the third portions 131 to 133 are integrally formed. The first to the third portions 131 to 133 may be portions provided independently of one another.

The first portion 131 is interposed between the walls 45A and the walls 45B. The first portion 131 separates the walls 45A from the walls 45B and electrically insulates the walls 45A from the walls 45B. The walls 45A are electrically connected to one another. The walls 45B are electrically connected to one another. The walls 45A and the walls 45B, however, are electrically insulated by the first portion 131.

The second portion 132 is interposed between the walls 45B and the walls 45C. The second portion 132 separates the walls 45B from the walls 45C and electrically insulates the walls 45B from the walls 45C. The walls 45B are electrically connected to one another. The walls 45C are electrically connected to one another. The walls 45B and the walls 45C, however, are electrically insulated by the second portion 132.

The walls 45A are connected to the frame 41. The walls 45B and the walls 45C are apart from the frame 41. The walls 45B and the walls 45C are electrically insulated from the frame 41 by the insulating portion 121.

The third portion 133 covers the upper end surfaces 45a of the walls 45A, 45B, and 45C. The third portion 133 may cover the lower end surfaces 45b of the walls 45A, 45B, and 45C. The third portion 133 is connected to the first portion 131 and the second portion 132.

The third portion 133 also covers an upper end surface 41c of the frame 41. The third portion 133 may cover a lower end surface 41d of the frame 41. The third portion 133 covering the upper end surface 41c of the frame 41 has an outer peripheral surface 133a. The outer peripheral surface 133a of the third portion 133 is connected to the outer peripheral surface 41b of the frame 41.

The second wire 122 and the third wire 123 are made of an electrical conductor, such as aluminum. In other words, the second and the third wires 122 and 123 are made of the same material as that of the collimating unit 31. The material of the second and the third wires 122 and 123 may be different from that of the collimating unit 31.

The second wire 122 passes through the third portion 133 of the insulating portion 121. A first end 122a of the second wire 122 is connected to the upper end surface 45a of the walls 45B. A second end 122b of the second wire 122 is exposed on the outer peripheral surface 133a of the third portion 133.

The third wire 123 passes through the third portion 133 of the insulating portion 121. A first end 123a of the third wire 123 is connected to the upper end surface 45a of the walls 45C. A second end 123b of the third wire 123 is exposed on the outer peripheral surface 133a of the third portion 133.

The second wire 122 and the third wire 123 may pass through the first portion 131 and the second portion 132. Furthermore, the second wire 122 and the third wire 123 may pass through the frame 41 and the walls 45. In this case, the second wire 122 and the third wire 123 are electrically insulated from the frame 41 and the walls 45 by part of the insulating portion 121.

The first electrode 71 according to the seventh embodiment is in contact with the outer peripheral surface 41b of the frame 41. As a result, the first power source 81 is electrically connected to the walls 45A via the first electrode 71 and the frame 41. The first electrode 71 and the first power source 81 are an example of a third applying unit.

The second electrode 72 is in contact with the end 122b of the second wire 122. As a result, the second power source 82 is electrically connected to the walls 45B via the second electrode 72 and the second wire 122. In other words, the second wire 122 electrically connects the walls 45B and the second power source 82. The second electrode 72 and the second power source 82 are an example of a fourth applying unit.

The third electrode 73 is in contact with the end 123b of the third wire 123. As a result, the third power source 83 is electrically connected to the walls 45C via the third electrode 73 and the third wire 123. In other words, the third wire 123 electrically connects the walls 45C and the third power source 83. The third electrode 73 and the third power source 83 are an example of the fourth applying unit.

The first power source 81 applies a positive voltage to the walls 45A via the first electrode 71 and the frame 41. The second power source 82 applies a positive voltage to the walls 45B via the second electrode 72 and the second wire 122. The third power source 83 applies a positive voltage to the walls 45C via the third electrode 73 and the third wire 123. The walls 45A, 45B, and 45C to which the positive voltages are applied generate respective electric fields.

The first to the third power sources 81 to 83 can apply different voltages to the walls 45A, 45B, and 45C, respectively. The voltage applied to the walls 45A, for example, is different from the voltage applied to the walls 45B and the voltage applied to the walls 45C. As a result, the electric field intensity of the electric field generated by the walls 45A, the electric field intensity of the electric field generated by the walls 45B, and the electric field intensity of the electric field generated by the walls 45C are different from one another.

In the sputtering apparatus 1 according to the seventh embodiment, the collimator 16 includes the walls 45A, the walls 45B, and the walls 45C. The third power supply device 63 can apply different voltages to the walls 45A, 45B, and 45C. By controlling the voltages applied to the walls 45A, 45B, and 45C, reduction in the use efficiency of the particles C is suppressed. The second wire 122 that electrically connects the second power source 82 and the walls 45B pass through the insulating portion 121. This structure suppresses an effect of the second wire 122 on generation of the plasma P in the sputtering apparatus 1, for example. In a case where the second wire 122 protrudes from the collimator 16, for example, the second wire 122 may possibly function as an electrode to prevent generation of the plasma P.

According to at least one of the embodiments described above, the power supply applies, to the flow rectifying unit, a voltage having the same polarity as that of electric charges in the particles. This mechanism suppresses reduction in the use efficiency of the particles.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A processing apparatus comprising:
an object placement unit configured to have an object placed thereon;
a source placement unit disposed apart from the object placement unit and configured to have a particle source placed thereon, the particle source being capable of ejecting a particle toward the object;
a flow rectifying member configured to be disposed between the object placement unit and the source placement unit in a first direction from the source placement unit to the object placement unit; and
a power supply configured to apply, to the flow rectifying member, a voltage having the same polarity as a polarity of an electric charge in the particle, wherein,
the flow rectifying member includes a first collimator and a second collimator,
the first collimator is disposed between the object placement unit and the source placement unit, includes a plurality of first walls, and is provided with a plurality of first through holes formed by the first walls and extending in the first direction,
the second collimator is disposed closer to the object placement unit than the first collimator between the object placement unit and the source placement unit, includes a plurality of second walls, and is provided with a plurality of second through holes formed by the second walls and extending in the first direction,
the power supply is configured to apply a voltage to at least one of the first collimator and the second collimator,
the flow rectifying member includes an intervening member disposed between the first collimator and the second collimator and having an insulation property,
the power supply includes a first applying unit configured to apply a voltage to the first collimator and includes a second applying unit configured to apply a voltage to the second collimator,
the intervening member includes a plurality of third walls connected to the first walls and the second walls and is provided with a plurality of third through holes formed by the third walls and extending in the first direction,
the first through holes and the second through holes communicate by the third through holes,
each of the first walls has a first inner surface that forms one of the first through holes,
each of the second walls has a second inner surface that forms one of the second through holes, and
the third walls form at least one of a protrusion protruding from the first inner surface in a direction in which the first inner surface faces and a recess recessed from the first inner surface in the direction in which the first inner surface faces.

2. The processing apparatus according to claim 1, wherein
the first wall has two first inner surfaces positioned opposite to each other and a first end surface facing the second wall,
the second wall has two second inner surfaces positioned opposite to each other and a second end surface facing the first end surface,
the third wall is positioned between one of the first inner surfaces and the other of the first inner surfaces and between one of the second inner surfaces and the other of the second inner surfaces in the direction in which the first inner surface faces and forms the recess,
the first end surface has a curved surface protruding toward to the second end surface, and
the second end surface has a curved surface protruding toward to the first end surface.

3. The processing apparatus according to claim 1, wherein the first collimator, the second collimator, and the intervening member are fixed to one another.

4. The processing apparatus according to claim 3, further comprising a first wire passing through the intervening member to connect the power supply and the second collimator.

5. The processing apparatus according to claim 1, wherein the flow rectifying member includes a reflector provided with an opening extending in the first direction and opening toward the source placement unit and the object placement unit, the reflector having an inner peripheral surface surrounding at least part of the source placement unit, the inner peripheral surface facing in a third direction between the first direction and a second direction orthogonal to the first direction, the inner peripheral surface forming the opening.

6. The processing apparatus according to claim 5, wherein the inner peripheral surface is a curved surface recessed with respect to the object placement unit.

7. The processing apparatus according to claim 5, further comprising:
a magnet configured to move along the source placement unit, wherein
the source placement unit is configured to be positioned between the reflector and the magnet, and
the reflector is configured to move together with the magnet.

8. A collimator comprising:
a plurality of first walls forming a plurality of first through holes extending in a first direction and having electrical conductivity;
a plurality of second walls forming a plurality of second through holes extending in the first direction, and having electrical conductivity, the first walls and the second walls arranged in the first direction; and
a plurality of third walls disposed between the first walls and the second walls, connected to the first walls and the second walls, forming a plurality of third through holes extending in the first direction and linking the first through holes and the second through holes, and having an insulation property, wherein,
each of the first walls has a first inner surface that forms one of the first through holes,
each of the second walls has a second inner surface that forms one of the second through holes, and
the third walls form at least one of a protrusion protruding from the first inner surface in a direction in which the first inner surface faces and a recess recessed from the first inner surface in the direction in which the first inner surface faces.

9. The collimator according to claim 8, further comprising a first wire passing through the third walls and connected to the second walls to electrically connect the second walls and an external power supply.

\* \* \* \* \*